(12) United States Patent
Honda

(10) Patent No.: US 7,142,035 B2
(45) Date of Patent: Nov. 28, 2006

(54) SIGNAL GENERATOR CIRCUIT AND LEVEL SHIFTER WITH SIGNAL GENERATOR CIRCUIT

(75) Inventor: Takashi Honda, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/014,840

(22) Filed: Dec. 20, 2004

(65) Prior Publication Data

US 2005/0275442 A1    Dec. 15, 2005

(30) Foreign Application Priority Data

Jun. 10, 2004    (JP) ............................. 2004-173151

(51) Int. Cl.
*H03L 5/00*    (2006.01)
(52) U.S. Cl. ........................................ 327/333; 326/68
(58) Field of Classification Search .................... None
See application file for complete search history.

(56) References Cited

U.S. PATENT DOCUMENTS

| | | | |
|---|---|---|---|
| 4,663,701 A * | 5/1987 | Stotts ........................... | 363/60 |
| 5,241,225 A | 8/1993 | Okajima et al. | |
| 5,339,742 A * | 8/1994 | Hulderman et al. ......... | 102/387 |
| 5,723,986 A * | 3/1998 | Nakashiro et al. ............. | 326/81 |
| 5,781,026 A * | 7/1998 | Chow ........................... | 326/26 |
| 5,828,231 A * | 10/1998 | Bazargan ...................... | 326/81 |
| 6,275,070 B1 * | 8/2001 | Pantelakis et al. ............ | 326/98 |
| 6,445,210 B1 * | 9/2002 | Nojiri ........................... | 326/68 |
| 6,741,106 B1 * | 5/2004 | Humphrey ................... | 327/108 |
| 6,741,283 B1 * | 5/2004 | Merrill et al. ............... | 348/308 |
| 6,850,090 B1 * | 2/2005 | Aoki ............................ | 326/68 |
| 6,933,755 B1 * | 8/2005 | Hong et al. .................. | 327/108 |
| 2005/0134355 A1 * | 6/2005 | Maede et al. ................ | 327/333 |
| 2005/0195179 A1 * | 9/2005 | Kobayashi et al. .......... | 345/204 |

* cited by examiner

*Primary Examiner*—Timothy P. Callahan
*Assistant Examiner*—Cassandra Cox
(74) *Attorney, Agent, or Firm*—Nixon Peabody LLP; Donald R. Studebaker

(57) ABSTRACT

A signal generator circuit prevents a shift of a timing at which an output signal at high voltage level changes from a timing at which an output signal at low voltage level changes, and a level shifter prevents a through current from flowing between a high voltage power supply and a ground potential. The signal generator circuit has an output adjustor circuit for outputting a first output signal and a second output signal in accordance with an input signal, and a level shifter for converting a voltage level in accordance with the input signal to generate a third output signal and a fourth output signal. In response to a rising of the input signal, the first output signal first changes, then the third and fourth output signals change, and subsequently the first output signal changes.

18 Claims, 20 Drawing Sheets

000
SIGNAL GENERATOR CIRCUIT AND LEVEL SHIFTER WITH SIGNAL GENERATOR CIRCUIT

BACKGROUND OF THE INVENTION

1. Field of the Invention

The present invention relates to a level shifter for simultaneously generating complementary outputs at "H" level or "L" level, and a signal generator circuit suitable for controlling the level shifter.

2. Description of the Related Art

Conventionally, there have existed several level shifters for simultaneously generating complementary outputs at "H" level or "L" level, for example, a first level shifter 10 shown in FIG. 1, a second level shifter 20 shown in FIG. 2, and the like. These level shifters are combined with a signal generator circuit 5 shown in FIG. 3, and receive part of signals outputted from the signal generator circuit 5 as control signals.

In the following, the signal generator circuit 5 will be first described with reference to FIGS. 3 and 4, the first level shifter 10 and second level shifter 20 will be next described with reference to FIGS. 1 and 2, and a first level shifter 100 which incorporates the signal generator circuit 5 described with reference to FIG. 3 (hereinafter called the "level shifter 100 having a signal generator circuit), and a second level shifter 200 which incorporates the signal generator circuit 5 described with reference to FIG. 4 (hereinafter called the "level shifter 200 having a signal generator circuit) will be finally described.

First, the signal generator circuit 5 will be described. FIG. 3 shows the configuration of the conventional signal generator circuit.

As shown in FIG. 3, the signal generator circuit 5 comprises an input terminal 11 for receiving an input signal IN01; an output terminal 12 for outputting a first output signal OUT01; an output terminal 13 for outputting a second output terminal OUT02; an output terminal 14 for outputting a third output signal OUT03; and an output terminal 15 for outputting a fourth output signal OUT04.

The signal generator circuit 5 also comprises an inverter INV; a first low voltage inverter INVL1; and a second low voltage inverter INVL2. These components form a low voltage signal generator unit for generating a signal at a low voltage level.

The low voltage generator unit is configured in the following manner. Specifically, the input signal IN01 applied from the input terminal 11 is inverted by the inverter INV, and branched into three. One of the three branched signals is outputted to the input side of the first low voltage inverter INVL1; one is outputted to the input side of the second low voltage inverter INVL2; and one is outputted to the outside from the output terminal 13 as the second output signal OUT02.

The low voltage signal generator unit is used for adjusting the output of a level shifter (first level shifter 10, second level shifter 20, and the like) combined therewith. Therefore, the low voltage signal generator unit may be in some cases called an "output adjustor circuit unit."

The signal generator circuit 5 also comprises a high voltage power supply VDDH, and a ground potential VSSH. "VSS" in the ground potential VSSH represents "ground," and H represents a high voltage output system. Disposed between the high voltage power supply VDDH and ground potential VSSH are a circuit comprised of a high voltage P-ch transistor P1, a high voltage inverter INVH1, the aforementioned first output terminal 14, and a high voltage N-ch transistor N1; and a circuit comprised of a high voltage P-ch transistor P2, a high voltage inverter INVH2, the aforementioned second output terminal 15, and a high voltage N-ch transistor N2. These circuits form a level shifter unit for generating a high voltage level signal.

The level shifter unit is configured in the following manner. Specifically, the high voltage P-ch transistors P1, P2 have their sources commonly connected to the high voltage power supply VDDH. Also, the high voltage P-ch transistor P1 has a gate branched for connection to a line which connects a drain of the high voltage P-ch transistor P2 with a drain of the high voltage N-ch transistor N2; and a drain connected to a drain of the high voltage N-ch transistor N1. The high voltage P-ch transistor P2 has a gate branched for connection to a line which connects the drain of the high voltage P-ch transistor P1 with the drain of the high voltage N-ch transistor N1; and the drain connected to the drain of the high voltage N-ch transistor N2. The high voltage P-ch transistors P1, P2 form a flip-flop circuit through the foregoing connections. The high voltage N-ch transistor N1 in turn has a source connected to the ground potential VSSH; a gate branched for connection to a line which connects the output side of the inverter INV with the input side of the first low voltage inverter INVL1; and a drain connected to the drain of the high voltage P-ch transistor P1. The high voltage N-ch transistor N2 has a source connected to the ground potential VSSH; a gate connected to the output side of the first low voltage inverter INLV1; and a drain connected to the drain of the high voltage P-ch transistor P2. The output terminal 14 for outputting the third output signal OUT03 is branched for connection to a line which connects the drain of the high voltage P-ch transistor P1 with the drain of the high voltage N-ch transistor N1 through the high voltage inverter INVH1. The output terminal 15 for outputting the fourth output signal OUT04 is branched for connection to a line which connects the drain of the high voltage P-ch transistor P2 with the drain of the high voltage N-ch transistor N2 through the high voltage inverter INVH2.

The low voltage signal generator unit generates a low voltage level signal, whereas the level shifter unit generates a high voltage level signal. Therefore, in the following, the low voltage signal generator unit may be in some cases called a "low voltage output section" and the level shifter unit a "high voltage output section."

FIG. 4 is a timing chart showing the operation of the conventional signal generator circuit. The signal generator circuit 5 outputs each output signal at a timing as shown in FIG. 4.

Next, the first level shifter 10 will be described. FIG. 1 is a diagram showing the configuration of the first level shifter.

As shown in FIG. 1, the first level shifter 10 comprises an input terminal 111 for receiving a first input signal IN11 for the first level shifter 10; an input terminal 112 for receiving a second input signal IN12; an input terminal 113 for receiving a third input signal IN13; an output terminal 114 for outputting a first amplified output signal OUT11; and an output terminal 115 for outputting a second amplified output signal OUT12.

The first level shifter 10 also comprises a first low voltage NAND element NADL11 and a second low voltage NAND element NANDL12 (hereinafter called the "first NAND L11" and "second NAND L12," respectively). The first NAND L11 has one input side connected to the input terminal 111 for receiving the first input signal IN11, and the other input side branched for connection to a line which connects the input terminal 112 for receiving the second input signal IN12 with the input side of the second NAND L12. The second NAND L12 has one input side connected to the output side of the NAND L11, and the other input side connected to the input terminal 112 for receiving the second input signal IN12.

The second output signal OUT02 of the signal generator circuit 5 shown in FIG. 3 is applied from the input terminal 112 as the second input signal IN12 of the first level shifter 10. Also, the third output signal OUT03 of the signal generator circuit 5 shown in FIG. 3 is applied from the input terminal 113 as the third input signal IN13 of the first level shifter 10.

The first level shifter 10 also comprises a high voltage power supply Vpp and a ground potential VSSH. Disposed between the high voltage power supply Vpp and ground potential VSSH are a circuit comprised of high voltage P-ch transistors P11–P12, a high voltage inverter INVH11, the aforementioned first output terminal 114, and a high voltage N-ch transistor N11; and a circuit comprised of high voltage P-ch transistors P13–P14, a high voltage inverter INVH12, the aforementioned second output terminal 115, and a high voltage N-ch transistor N12.

These circuits are configured in the following manner. Specifically, the high voltage P-ch transistors P11, P13 have their sources commonly connected to the high voltage power supply Vpp, and their gates connected to the input terminal 113 for receiving the third input signal IN13. The high voltage P-ch transistor P11 has a drain connected to a source of the high voltage P-ch transistor P12, while the high voltage P-ch transistor P13 has a drain connected to a source of the high voltage P-ch transistor P14. The high voltage P-ch transistor P12 also has the source connected to the drain of the high voltage P-ch transistor P1, a gate branched for connection to a line which connects the drain of the high voltage P-ch transistor P14 with a drain of the high voltage N-ch transistor N12, and a drain connected to a drain of the high voltage N-ch transistor N11. The high voltage P-ch transistor P14 has a source connected to the drain of the high voltage P-ch transistor P13, a gate branched for connection to a line which connects the drain of the high voltage P-ch transistor P12 with the drain of the high voltage N-ch transistor N11, and a drain connected to the drain of the high voltage N-ch transistor N12. The high voltage P-ch transistors P12, P14 form a flip-flop circuit through the foregoing connections. The high voltage N-ch transistor N11 has the source connected to the ground potential VSSH, the gate branched for connection to a line which connects the output side of the first NAND L11 with one input side of the second NAND L12, and the drain connected to the drain of the high voltage P-ch transistor P12. The high voltage N-ch transistor N12 has a source connected to the ground potential VSSH, a gate connected to the output side of the second NAND L12, and a drain connected to the drain of the high voltage P-ch transistor P14. The output terminal 114 for outputting a first amplified output signal OUT11 is branched for connection to a line which connects the drain of the high voltage P-ch transistor P12 with the drain of the high voltage N-ch transistor N11 through the high voltage inverter INVH11. The output terminal 115 for outputting a second amplified output signal OUT12 is branched for connection to a line which connects the drain of the high voltage P-ch transistor P14 with the drain of the high voltage N-ch transistor N12 through the high voltage inverter INVH12.

Next, the second level shifter 20 will be described. FIG. 2 is a diagram showing the configuration of the second level shifter.

As shown in FIG. 2, the second level shifter 20 comprises an input terminal 211 for receiving a first input signal IN11 for the second level shifter 20; an input terminal 212 for receiving a second input signal IN12'; an input terminal 213 for receiving a third input signal IN13'; an output terminal 214 for outputting the first amplified output signal OUT11; and an output terminal 215 for outputting the second amplified output signal OUT12.

The second level shifter 20 also comprises a first low voltage NOR element NOR L21 and a second low voltage NOR-element NOR L22 (hereinafter called the "first NOR L21" and "second NOR L22," respectively). The first NOR L21 has one input side connected to the input terminal 211 for receiving the first input signal IN11, and the other input side branched for connection to a line which connects the input terminal 212 for receiving the second input signal IN12' with the input side of the second NOR L22. The second NOR L22 has one input side connected to the output side of the NOR L21, and the other input side connected to the input terminal 212 for receiving the input signal IN12'.

The first output signal OUT01 of the signal generator circuit 5 shown in FIG. 3 is applied from the input terminal 212 as the second input signal IN12' of the second level shifter 20. Also, the output signal OUT04 of the signal generator circuit 5 shown in FIG. 3 is applied from the input terminal 213 as the third input signal IN13' of the second level shifter 20.

The second level shifter 20 also comprises a high voltage power supply Vpp and a ground potential VSSH. Disposed between the high voltage power supply Vpp and ground potential VSSH are a circuit comprised of high voltage P-ch transistors P21-P22, a high voltage inverter INVH21, the aforementioned first output terminal 214, and a high voltage N-ch transistor N21; and a circuit comprised of high voltage P-ch transistors P23—P23, a high voltage inverter INVH22, the aforementioned second output terminal 215, and a high voltage N-ch transistor N22.

These circuits are configured in the following manner. Specifically, the high voltage P-ch transistors P21–P24 have their sources commonly connected to the high voltage power supply Vpp. The high voltage P-ch transistor P21 has the source connected to the high voltage power supply Vpp, a gate connected to the input terminal 213 for receiving the third input signal IN13', and a drain branched for connection to a line which connects a drain of the high voltage P-ch transistor P22 with a drain of the high voltage P-ch transistor N21. The high voltage P-ch transistor P22 has the source connected to the high voltage power supply Vpp, a gate branched for connection to a line which connects a drain of the high voltage P-ch transistor P23 with a drain of the high voltage N-ch transistor N22, and a drain connected to the drain of the high voltage N-ch transistor N21. The high voltage P-ch transistor P22 has the source connected to the high voltage power supply Vpp, a gate branched for connection to a line which connects the drain of the high voltage P-ch transistor P22 with the drain of the high voltage N-ch transistor N21, and a drain connected to the drain of the high voltage N-ch transistor N22. The high voltage P-ch transistor P23 has the source connected to the high voltage power supply Vpp, a gate branched for connection to a line which connects the drain of the high voltage P-ch transistor P22 with the drain of the high voltage N-ch transistor N21, and a drain connected to the drain of the high voltage N-ch transistor N22. The high voltage P-ch transistor P24 has the source connected to the high voltage power supply Vpp, a gate connected to the input terminal 213 for receiving the input signal IN13', and a drain branched for connection to a line which connects the drain of the high voltage P-ch transistor P23 with the drain of the high voltage P-ch transistor P22. The high voltage P-ch transistor P22 and high voltage P-ch transistor P23 form a flip-flop circuit through the foregoing connections. The high voltage N-ch transistor N21 has a source connected to the ground potential VSSH, a gate branched for connection to a line which connects the output side of the first NOR L21 with one input side of the second NOR L22, and a drain branched for connection to a line which connects the drain of the high voltage P-ch transistor P21 with the drain of P22. The high voltage N-ch transistor N22 has a source connected to the ground potential VSSH, a gate connected to the output side of the second NOR L22, and a drain branched for connection to a line which connects the drain of the high voltage P-ch transistor P23 with the drain of P24. The output terminal 214 for outputting a first amplified output signal OUT11 is branched for connection to a line which connects the drain of the high voltage P-ch transistor P22 with the drain of the high voltage N-ch transistor N21 through the high voltage inverter INVH21. The output terminal 215 for outputting a second amplified output signal OUT12 is branched for connection to a line which connects the drain of the high voltage P-ch transistor P23 with the drain of the high voltage N-ch transistor N22 through the high voltage inverter INVH22.

Next, the level shifter 100 having a signal generator circuit will be described. FIG. 5 is a diagram showing the configuration of the conventional level shifter having a signal generator circuit.

As shown in FIG. 5, the level shifter 100 having a signal generator circuit is a combination of the signal generator circuit 5 with the first level shifter 10, which is made such that the second output signal OUT02 of the signal generator circuit 5 shown in FIG. 3 serves as the second input signal IN12 of the first level shifter 12 shown in FIG. 15, and the third output signal OUT03 of the signal generator circuit 5 shown in FIG. 3 serves as the third input signal IN13 of the first level shifter 10 shown in FIG. 1.

Next, the level shifter 200 having a signal generator circuit will be described. FIG. 6 is a diagram showing the configuration of the conventional level shifter having a signal generator circuit.

As shown in FIG. 6, the level shifter 200 having a signal generator circuit is a combination of the signal generator circuit 5 with the second level shifter 20, which is made such that the first output signal OUT01 of the signal generator circuit 5 shown in FIG. 3 serves as the second input signal IN12' of the second level shifter 20 shown in FIG. 2, and the fourth output signal OUT04 of the signal generator circuit 5 shown in FIG. 3 serves as the third input signal IN13' of the second level shifter 20 shown in FIG. 2.

The level shifters 100, 200 having a signal generator circuit shown in FIGS. 5 and 6, and the like simultaneously generate complementary outputs at "H" level or "L" level.

Such a signal generator circuit and a level shifter having a signal generator circuit are disclosed, for example, in Laid-open Japanese Patent Application No. 4-223713 (Patent Document 1).

The conventional level shifters 100, 200 having a signal generator circuit have a problem that a through current may flow between the high voltage power supply Vpp and the ground potential VSSH.

This problem occurs in the following manner. Specifically, the conventional level shifters 100, 200 having a signal generator circuit employ the output signals of the signal generator circuit 5 as a control signal for a high voltage level and as a control signal for a low voltage level without adjusting their timings. However, the conventional signal generator circuit 5 may experience a shift of a timing at which an output signal at high voltage level changes from a timing at which an output at low voltage level changes due to the characteristics of the high voltage elements and low voltage elements. Particularly, when the timing at which the output signal at high voltage level changes overlaps with the timing at which the output signal at low voltage level changes in the signal generator circuit 5, a through current flows between the high voltage power supply Vpp and the ground potential VSSH of the conventional level shifters 100, 200 having a signal generator circuit.

For example, in the level shifter 100 having a signal generator circuit shown in FIG. 5, the third input signal IN13, which is a control signal for the high voltage level (i.e., the third output signal OUT03 of the signal generator circuit 5), changing from "L" level to "H" level, and the second input signal IN12, which is a control signal for the low voltage level (i.e., the second output signal OUT02 of the signal generator circuit 5), changing from "H" level" to "L" level cause both the amplified output signals OUT11, OUT12 to transition to the high voltage "H" level. However, if the second input signal IN12 transitions to "L" level before the third input signal IN13 transitions to "H" level, a through current flows between the high voltage power supply Vpp and the ground potential VSSH through the high voltage P-ch transistors P11, P12 and high voltage N-ch transistor N11 or through the high voltage P-ch transistors P13, P14 and high voltage N-ch transistor N12.

On the other hand, in the level shifter 200 having a signal generator circuit shown in FIG. 6, the second input signal IN12', which is a control signal for the low voltage level (i.e., the first output signal OUT01 of the signal generator circuit 5), changing from "L" level to "H" level, and the third input signal IN13', which is a control signal for the high voltage level (i.e., the fourth output signal OUT04 of the signal generator circuit 5) changing from "H" level to "L" level cause both the amplified output signals OUT11, OUT12 to transition to the low voltage "L" level. However, if the second input signal IN12' transitions to "L" level before the third input signal IN13' transitions to "H" level in the level shifter 200 having a signal generator circuit, a through current flows between the high voltage power supply Vpp and the ground potential VSSH through the high voltage P-ch transistor P22, high voltage N-ch transistor N21, high voltage P-ch transactor P23, and high voltage N-ch transistor N22.

As mentioned above, the conventional level shifters 100, 200 having a signal generator circuit have a problem that a through current flows between the high voltage power supply Vpp and the ground potential VSSH when the timing at which the output signal at high voltage level of the signal generator circuit 5 changes shifts from the timing at which the output signal at low voltage level changes.

It should be noted that a faint through current merely flows in the respective level shifters 100, 200 having a signal generator circuit. However, since an apparatus typically incorporates an immense number of level shifters 100, 200 having a signal generator circuit, through currents flowing in the overall apparatus sum up to an immense amount. This causes a problem that the through currents break a variety of circuits incorporated in the apparatus. Another problem lies in that an immense amount of power is consumed for nothing.

For example, a source driver for a large TFT display incorporates an immense number of level shifters 100, 200 having a signal generator circuit for controlling (selecting)

outputs with a high voltage level. Since the number of level shifters is calculated by the number of gradation bits multiplied by the number of outputs, a large TFT display will include 3312 level shifters when it has eight gradation bits (256 gradation levels) and 414 channels of outputs. Even though a faint amount of through current flows in each of individual level shifters 100, 200 having a signal generator circuit, the through currents flowing in such a number of level shifters 100, 200 having a signal generator circuit will sum up to an immense amount in the overall apparatus. Supposing that a certain circuit incorporated in an apparatus is applied with a through current which exceeds a tolerance of the circuit, the circuit will be broken. In addition, since the through current is a useless current, an immense amount of power is consumed for nothing.

SUMMARY OF THE INVENTION

It is an object of the present invention to provide a signal generator circuit which prevents a timing at which an output signal at high voltage level changes from shifting from a timing at which an output signal at low voltage level changes such that no through current flows between a high voltage power supply Vpp and a ground potential VSSH of a level shifter with the signal generator circuit (particularly, a signal generator circuit which shifts a timing to generate a low voltage control signal for controlling the level shifter from a timing at which a high voltage control signal for controlling the level shifter is generated, such that a timing at which the output signal transitions to "H" is advanced, and a timing at which the output signal transitions to "L" is delayed).

It is another object of the present invention to provide a level shifter having a signal generator circuit which eliminates a through current by using the foregoing signal generator circuit.

To solve the aforementioned problem, a signal generator circuit according to a first aspect of the present invention has an output adjustor circuit for outputting a first output signal and a second output signal in accordance with an input signal, and a level shifter unit for converting a voltage level in accordance with the input signal to output a third output signal and a fourth output signal, wherein in response to a rising of the input signal, the first output signal first changes, the third and fourth output signals next change, and then the second output signal changes, and in response to a falling of the input signal, the second output signal first changes, the third and fourth output signals change, and then the first output signal changes. The signal generator circuit according to the first aspect of the present invention can operate subsequent circuits with stability because the timing at which the output signal at high voltage level changes does not shift from the timing at which the input signal at low voltage signal changes.

Also, a level shifter having a signal generator circuit according to a second aspect of the present invention has the signal generator circuit according to the first aspect of the present invention, and is characterized by outputting a first and a second amplified output signal which have amplified voltage levels, and simultaneously transition to "H" level or "L" level based on one of the first and second output signals and one of the third and fourth output signals of the signal generator circuit. The level shifter having a signal generator circuit according to the second aspect of the present invention can prevent a through current from occurring between the high voltage power supply and the ground potential the timing at which the output signal at high voltage level changes does not shift from the timing at which the input signal at low voltage level changes.

According to the present invention, a signal generator circuit can be provided for eliminating a shift of a timing at which an output signal at high voltage level changes from a timing at which an input signal at low voltage level changes.

Further, by incorporating the signal generator circuit according to the present invention, a level shifter can be provided for eliminating a through current.

DETAILED DESCRIPTION OF THE INVENTION

Figure 1:
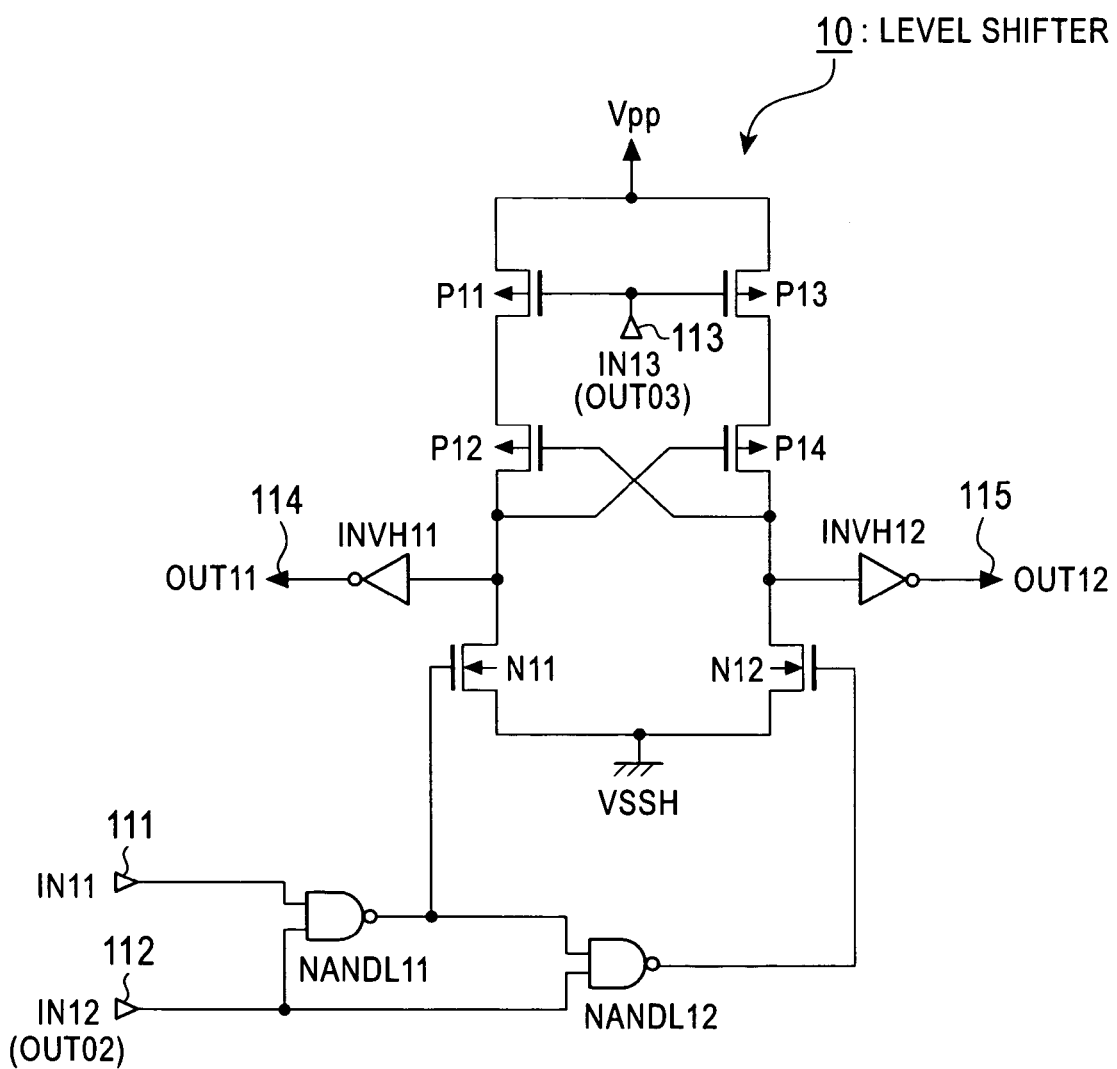
FIG. 1 is a diagram showing the configuration of a first level shifter.

In the following, embodiments of the present invention will be described with reference to the accompanying drawings. The respective diagrams generally show simply in such a degree to permit the present invention to be understood. Therefore, the present invention is not limited only to shown examples. Also, in the respective figures, common components or similar components are designated the same reference numerals, and repeated description thereon is omitted.

Figure 7:
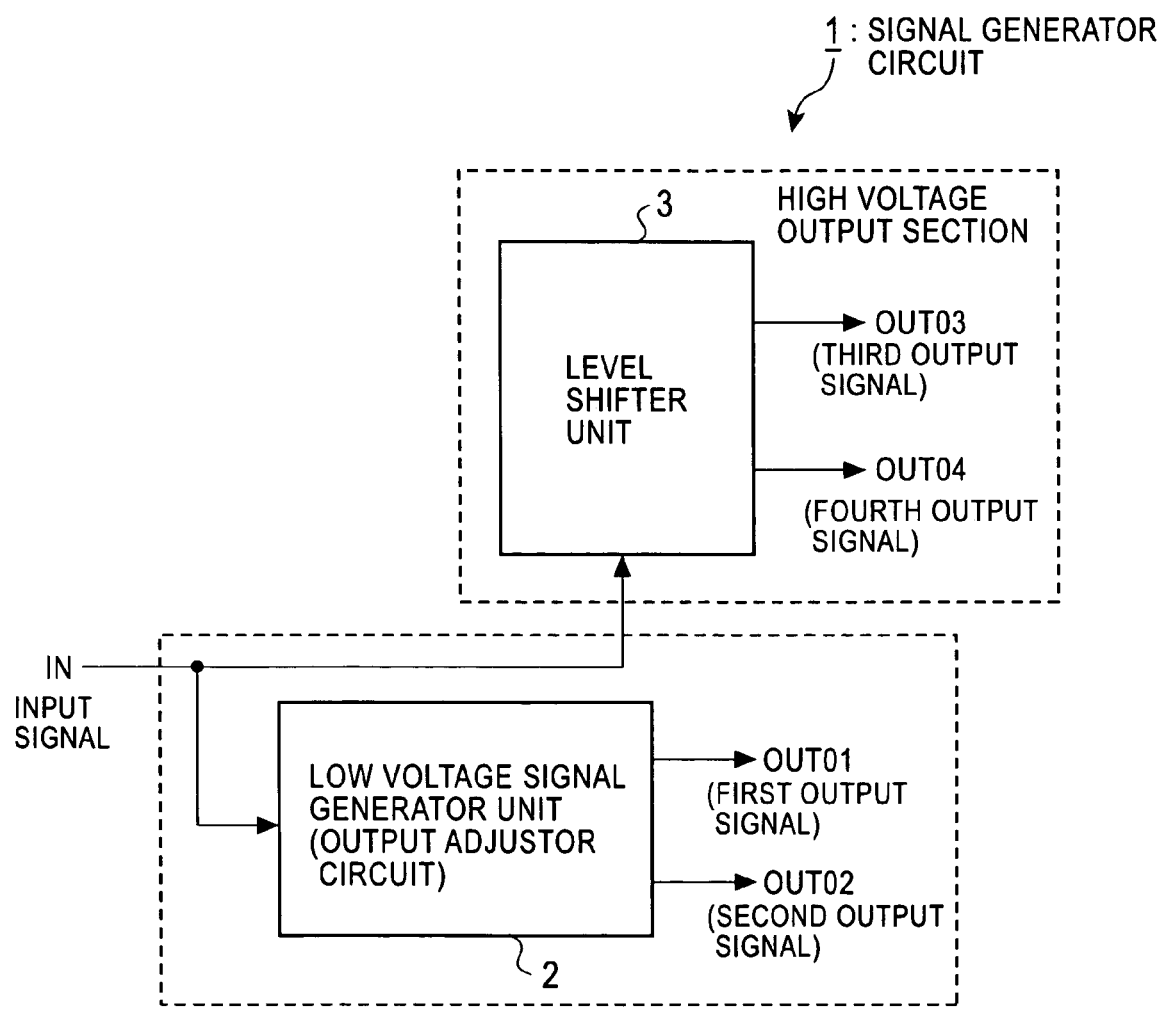
FIG. 7 is a diagram generally showing a signal generator circuit.

FIG. 7 is a diagram generally showing a signal generator circuit.

As shown in FIG. 7, the signal generator circuit 1 according to the present invention comprises a low voltage signal generator unit 2 for outputting a first signal OUT01 and a second signal OUT02 at low voltage level in accordance with an input signal IN; and a level shifter unit 3 for converting the voltage level in accordance with the input signal IN to output a third signal OUT03 and a fourth signal OUT04 at high voltage level. The signal generator circuit 1 is combined with a level shifter such as the aforementioned first level shifter 10 and second level shifter 20, and the like to form a level shifter having a signal generator circuit.

The low voltage signal generator unit 2 is used to adjust outputs of a level shifter combined therewith (first level shifter 10, second level shifter 20, and the like). Therefore, in the following, the low voltage signal generator unit 2 may be sometimes called the "output adjuster circuit unit 2." Also, the level shifter unit 3 generates signals at high voltage level, as opposed to the low voltage signal generator unit 2 which generates signals at low voltage level. Therefore, in the following, the low voltage signal generator unit 2 may be sometimes called the "low voltage output section," and the level shifter unit 3 may be called the "high voltage output section."

Figure 8:
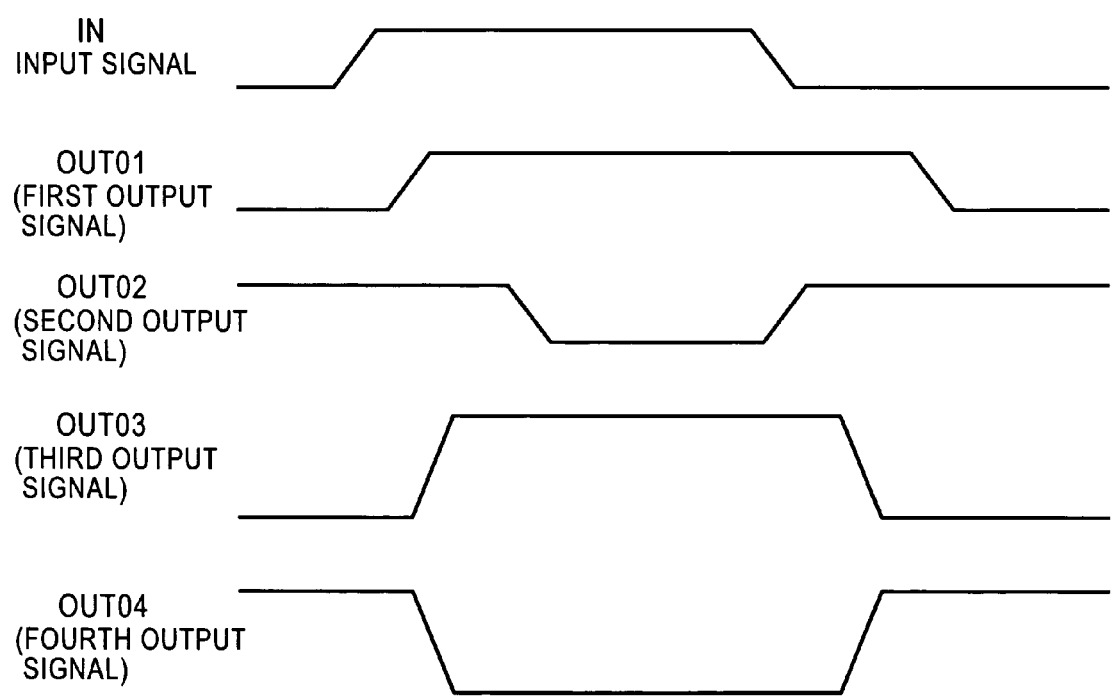
FIG. 8 is a timing chart showing the operation of the signal generator circuit.

FIG. 8 is a timing chart showing the operation of the signal generator circuit.

As shown in FIG. 8, in the signal generator circuit 1, the first output OUT01 first changes in response to a rising of the input signal IN, and then the third and fourth output signal OUT03, OUT04 change, followed by a change in the second output signal OUT02. In response to a falling of the input signal, the second output signal OUT02 first changes, then the third and fourth output signals OUT03, OUT04 change, followed by a change in the first output signal OUT01. Assume herein that the first and third output signals OUT01, OUT03 are signals which change in the same phase direction in response to the input signal IN, while the second and fourth output signals OUT02, OUT04 are signals which change in the reverse directions in response to the input signal IN. The third output signal OUT03 and fourth output signal OUT04 are outputs opposite to each other. Also, since the amplitudes of the third and fourth output signals OUT03, OUT04 are output through the level shifter unit 3 for amplifying a voltage level, they are larger than the amplitudes of the first and second output signals OUT01, OUT02.

Specifically, the signal generator circuit 1 is configured as described in the following first and second embodiments. In the following, a signal generator circuit 1 according to a first embodiment is described as a signal generator circuit 6, and a signal generator circuit 1 according to a second embodiment is described as a signal generator circuit 7.

(Configuration of Signal Generator Circuit)

Figure 9:
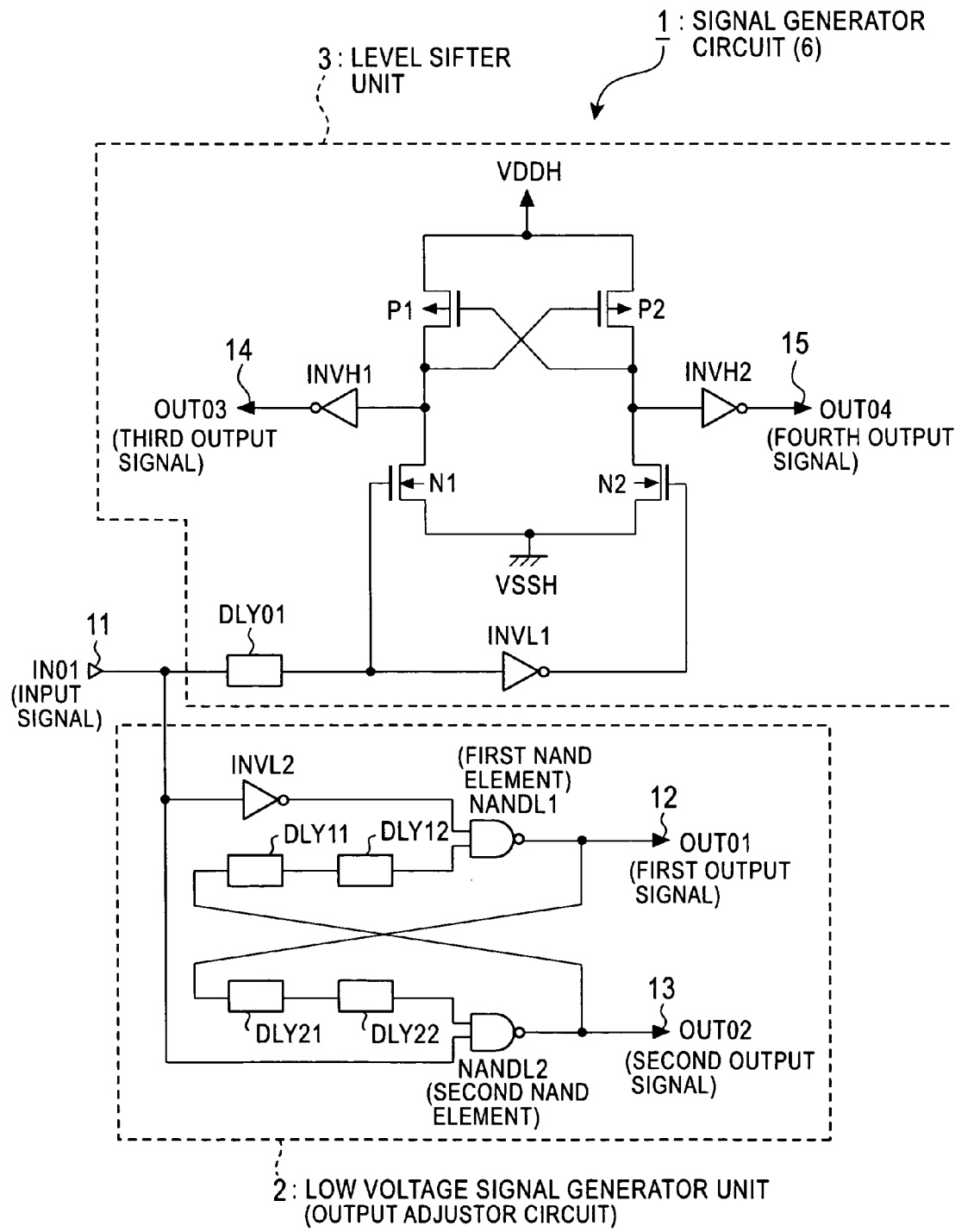
FIG. 9 is a diagram showing the configuration of a signal generator circuit according to a first embodiment.

In the following, the signal generator circuit 6 according to a first embodiment of the present invention will be described in regard to its specific configuration. FIG. 9 is a diagram showing the configuration of the signal generator circuit according to the first embodiment.

As shown in FIG. 9, the signal generator circuit 6 comprises an input terminal 11 for receiving an input signal IN01; an output terminal 12 for outputting a first output signal OUT01; an output terminal 13 for outputting a second output signal OUT02; delay elements DLY11–DLY12, DLY21–DLY22; a first low voltage inverter INVL1; a second low voltage inverter INVL2; a first low voltage NAND element NAND L1 (first NAND L1); and a second low voltage NAND element NAND L2 (second NAND L2). These components form a low voltage signal generator unit (output adjustor circuit unit) 2 for generating signals at low voltage level. The first and second output signals OUT01, OUT02 are a first and a second output signal at low voltage level, while the output terminals 12, 13 are low voltage output terminals for outputting output signals at low level.

The signal generator circuit 6 branches the input signal IN01 applied from the input terminal 11 into three, one of which is outputted to one end of the delay element DLY01, one of which is outputted to the input side of the second low voltage inverter INVL2, and one of which is outputted to the other input side of the second NAND L2.

The delay element DLY01 has one end connected to the input terminal 11 for receiving the input signal IN01, and the other end connected to the input side of the first low voltage inverter INVL1 and to a gate of a high voltage N-ch transistor N1. The output side of the first INVL1 is connected to a gate of a high voltage N-ch transistor N2.

The second low voltage inverter INVL2 has one end connected to the input terminal 11 for receiving the input signal IN01, and the other end connected to one input side of the first NAND L1. The first NAND L1 has one input side connected to the input terminal 11 for receiving the input signal IN01 through the low voltage inverter INVL2, and the other input side branched for connection to a line which connects the output side of the second NAND L2 with the second output terminal 13 through a plurality of delay elements (in FIG. 9, two delay elements DLY11–DLY12).

The second NAND L2 has one input side branched for connection to a line which connects the output side of the first NAND L1 with the first output terminal 12 through a plurality of delay elements (in FIG. 9, two delay elements DLY21–DLY22), and the other input side connected to the input terminal 11 for receiving the signal IN01.

The first NAND L1 and second NAND L2 have one input side connected to the output side of the other party through a plurality of delay elements (in FIG. 9, two delay elements DLY11–DLY12 and DLY21–DLY22, respectively), with the intention that the second output signal OUT02 is varied slower than the other output signals (i.e.,. the first output signal OUT01, third output signal OUT03, and fourth output signal OUT04).

The signal generator circuit 6 as described above is configured to generate the first output signal OUT01 in accordance with an inverted version of the input signal IN01 and a delayed version of the second output signal. The signal generator circuit 6 is also configured to generate the second output signal OUT02 in accordance with the input signal IN01 and a delayed version of the first output signal OUT01.

The signal generator circuit 6 also comprises an output terminal 14 for outputting a third output signal OUT03; an output terminal 15 for outputting a fourth output signal OUT04; a delay element DLY01; a first low voltage inverter INVL1; a high voltage power supply VDDH; and a ground potential VSSH. Disposed between the high voltage power supply VDDH and ground potential VSSH are a circuit comprised of a high voltage P-ch transistor P1, a high voltage inverter INVH1, the first output terminal 14, and the high voltage N-ch transistor N1; and a circuit comprised of a high voltage P-ch transistor P2, a high voltage inverter INVH2, the second output terminal 15, and the high voltage N-ch transistor N2. These components form a level shifter unit 3 for generating output signals at high voltage level. The third and fourth output signals OUT03, OUT04 are a first and a second output signals at high voltage level, and the output terminals 14, 15 are high voltage output terminals for outputting output signals at high voltage level.

The delay element DLY01 has one end connected to the input terminal 11 for receiving the input signal IN01, and the other end connected to the input side of the first low voltage inverter INVL1 and to the gate of the high voltage N-ch transistor N1. The output side of the first INVL1 is connected to the gate of the high voltage N-ch transistor N2.

The high voltage P-ch transistors P1, P2 have their sources commonly connected to the high voltage power supply VDDH. The high voltage P-ch transistor P1 has a gate branched for connection to a line which connects a drain of the high voltage P-ch transistor P2 with a drain of the high voltage N-ch transistor N2, and a drain connected to a drain of the high voltage N-ch transistor N1. The high voltage P-ch transistor P2 has a gate branched for connection to a line which connects the drain of the high voltage P-ch transistor P1 with the drain of the high voltage N-ch transistor N1, and the drain connected to the drain of the high voltage N-ch transistor N2. The high voltage P-ch transistors P1, P2 form a flip-flop circuit through the foregoing connections. The high voltage N-ch transistor N1 has a source connected to the ground potential VSSH, the gate branched for connection to a line which connects the other end of the delay element DLY01 with the input side of the first low voltage inverter INVL1, and the drain connected to the drain of the high voltage P-ch transistor P1. The high voltage N-ch transistor N2 has a source connected to the ground potential VSSH, the gate connected to the output side of the first low voltage inverter INVL1, and the drain connected to the drain of the high voltage P-ch transistor P2. The output terminal 14 for outputting the third output signal OUT03 is branched for connection to a line which connects the drain of the high voltage P-ch transistor P1 with the drain of the high voltage N-ch transistor N1 through the high voltage inverter INVH1. The output terminal 15 for outputting the fourth output signal OUT04 in turn is branched for connection to a line which connects the drain of the high voltage P-ch transistor P2 with the drain of the high voltage N-ch transistor N2 through the high voltage inverter INVH2.

The signal generator circuit 6 according to the first embodiment forces the level shifter unit to generate output signals at high voltage level by delaying and amplifying the input signal IN01. Also, output signals at low voltage level are generated by applying the input signal IN01 to one input side of a cross-connected NAND gate of RS-FF. The signal generator circuit 6 as described shifts a timing of generating a combination of an output signal at high voltage level with an output signal with a low voltage level in accordance with a change in the input signal IN01 such that a timing at which the output signal transitions to "H" level is advanced and a timing at which the output transitions to "L" level is delayed.

(Operation of Signal Generator Circuit)

Figure 10:
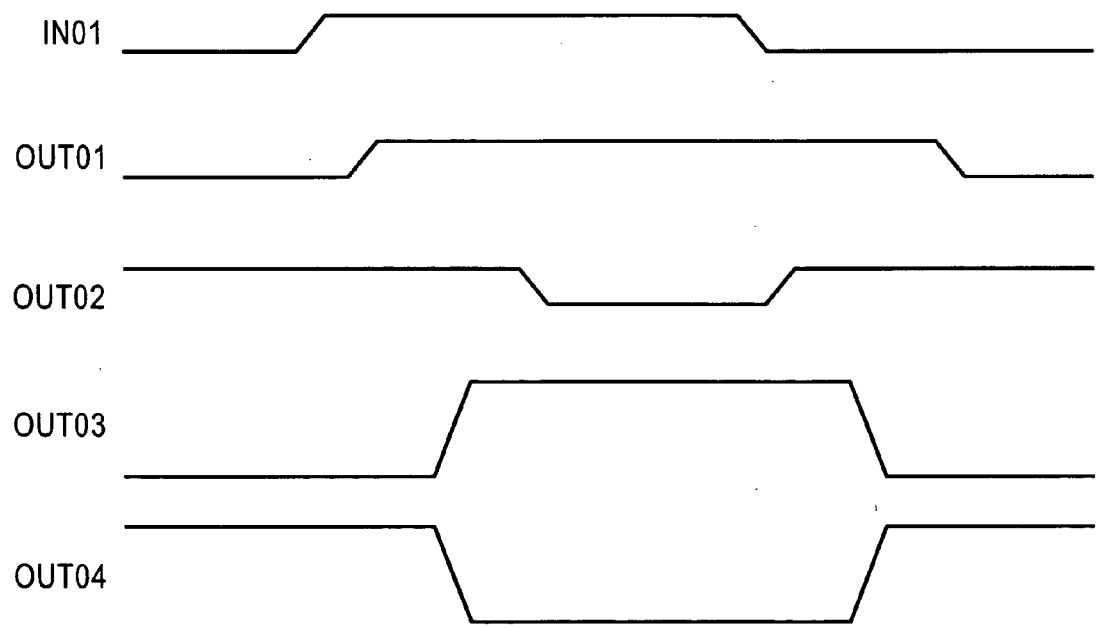
FIG. 10 is a timing chart showing the operation of the signal generator circuit according to the first embodiment.

In the following, the operation of the signal generator circuit will be described in accordance with the first embodiment of the present invention. FIG. 10 is a timing chart showing the operation of the signal generator circuit according to the first embodiment.

In an initial state, the input signal IN01 at "L" level is applied to the signal generator circuit 6 from the input terminal 11. In this event, since the second NAND 12 has the input signal IN01 at "L" level on the other input side, the second NAND L2 outputs the second output signal OUT01 at "H" level. The first NAND L1 in turn, receives on one input side a signal at "H" level which is the inverse of the input signal IN01 at "L" level through the second low voltage inverter INVL2, and receives on the other output side the output signal OUT02 at "H" level through a plurality of delay element, so that the first NAND L1 outputs the first output signal OUT01 at "L" level.

The high voltage N-ch transistor N1 receives at the gate the input signal IN01 at "L" level through the delay element DLY01, and therefore remains off. On the other hand, the high voltage N-ch transistor N2 receives at the gate a signal at "H" level which is the inverse of the input signal IN01 at "L" level through the delay element DLY01 and first low voltage inverter INVL1, and therefore remains on. The high voltage P-ch transistor P1 remains on because the high voltage N-ch transistor N2 is on, and the high voltage P-ch transistor Pi receives a signal at "L" level at the gate. On the other hand, the high voltage P-ch transistor P2 remains off because the high voltage N-ch transistor N1 is off, and the high voltage P-ch transistor P2 receives a signal at "H" level at the gate. Consequently, the potential between the drain of the high voltage P-ch transistor P1 and the drain of the high voltage N-ch transistor N1 is at "H" level, so that the potential between the drain of the high voltage P-ch transistor P2 and the drain of the high voltage N-ch transistor N2 is at "L" level. As a result, the third output signal OUT03 is made to be a signal at "L" level, which is the inverse of the signal at "H" level, by the first high voltage inverter INVH1. The fourth output signal OUT04 in turn is made to be a signal at "H" level, which is the inverse of the signal at "L" level, by the second high voltage inverter INVH2.

Thus, the signal generator circuit 6, upon receipt of the input signal IN01 at "L" level from the input terminal 11 in the initial state, outputs the first output signal OUT01 at "L" level from the output terminal 12; outputs the second output signal OUT02 at "H" level from the output terminal 13; outputs the third output signal OUT03 at "L" level from the output terminal 14; and outputs the fourth output signal OUT04 at "H" level from the output terminal 15.

Next, description will be made on a change in each signal when the input signal IN01 changes from "L" level to "H" level.

In this event, components which first activate are those not provided with delay elements on the input side. As a result, the output signal of the second low voltage inverter INVL2 first changes from "H" level to "L" level. This causes the first output signal OUT01 outputted from the first NAND L1 to change from "L" level to "H" level.

In this event, a signal applied to one input side of the second NAND L2 remains at "L" level with the aid of a plurality of delay elements (in FIG. 9 two DLY21–DLY22). Therefore, the second output signal OUT02 outputted from the second NAND L2 still remains unchanged (i.e., remains at "H" level).

Components which next activate are those provided with one delay element on the input side. As a result, the level shifter unit changes, causing the high voltage N-ch transistor N1 to turn on, and the high voltage N-ch transistor N2 to turn off. Since the gate potential of the high voltage P-ch transistor P2 changes from "H" level to "L" level by the high voltage N-ch transistor N1 turning on, the high voltage P-ch transistor P2 changes from off-state to on-state. Since the gate potential of the high voltage P-ch transistor P1 changes from "L" level to "H" level by the high voltage P-ch transistor P2 turning on, the high voltage P-ch transistor P1 changes from on-state to off-state. Thus, the third output signal OUT03 changes from "L" level to "H" level, while the fourth signal OUT04 changes from "H" level to "L" level.

Figure 2:
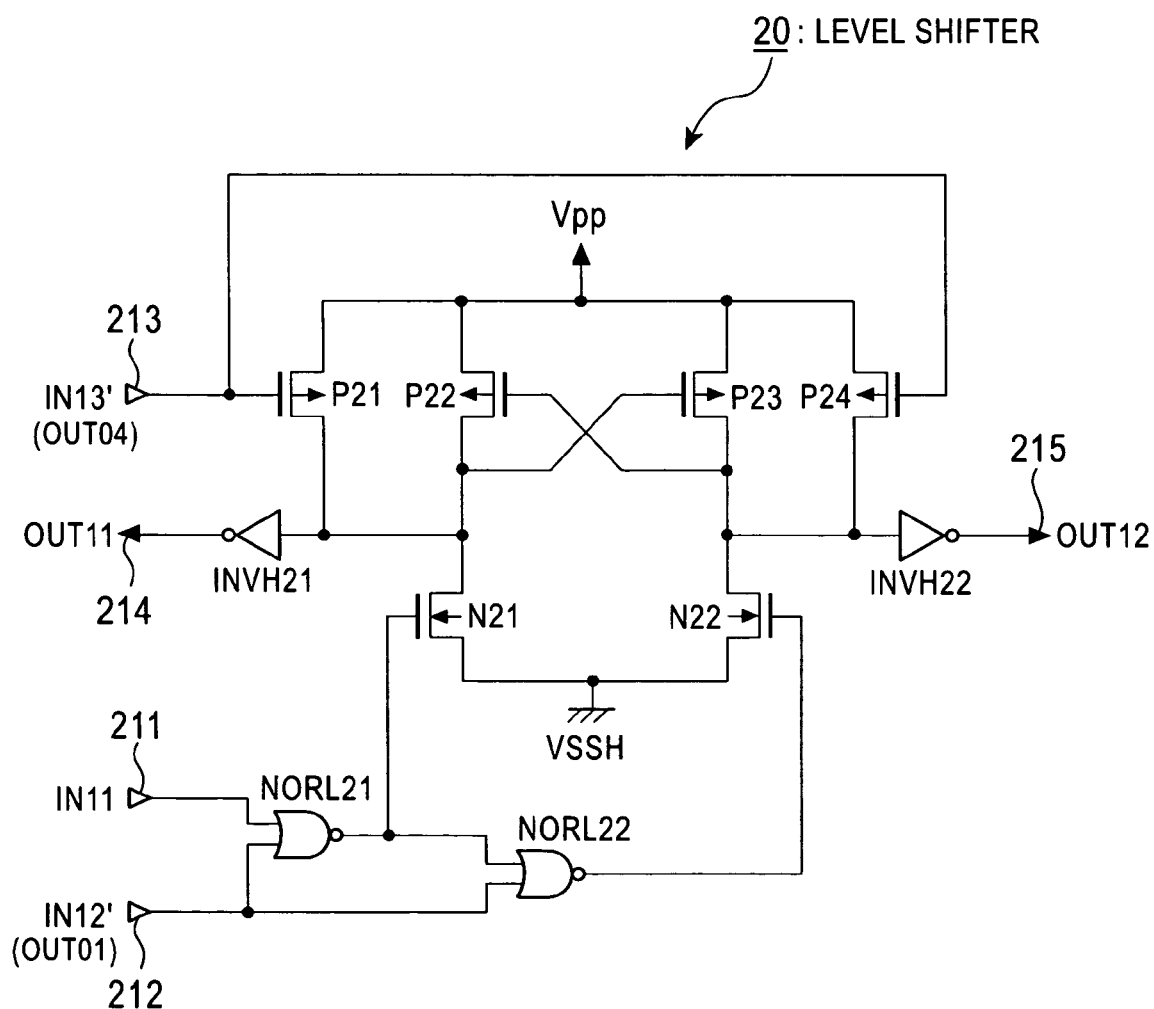
FIG. 2 is a diagram showing the configuration of a second level shifter.
Figure 3:
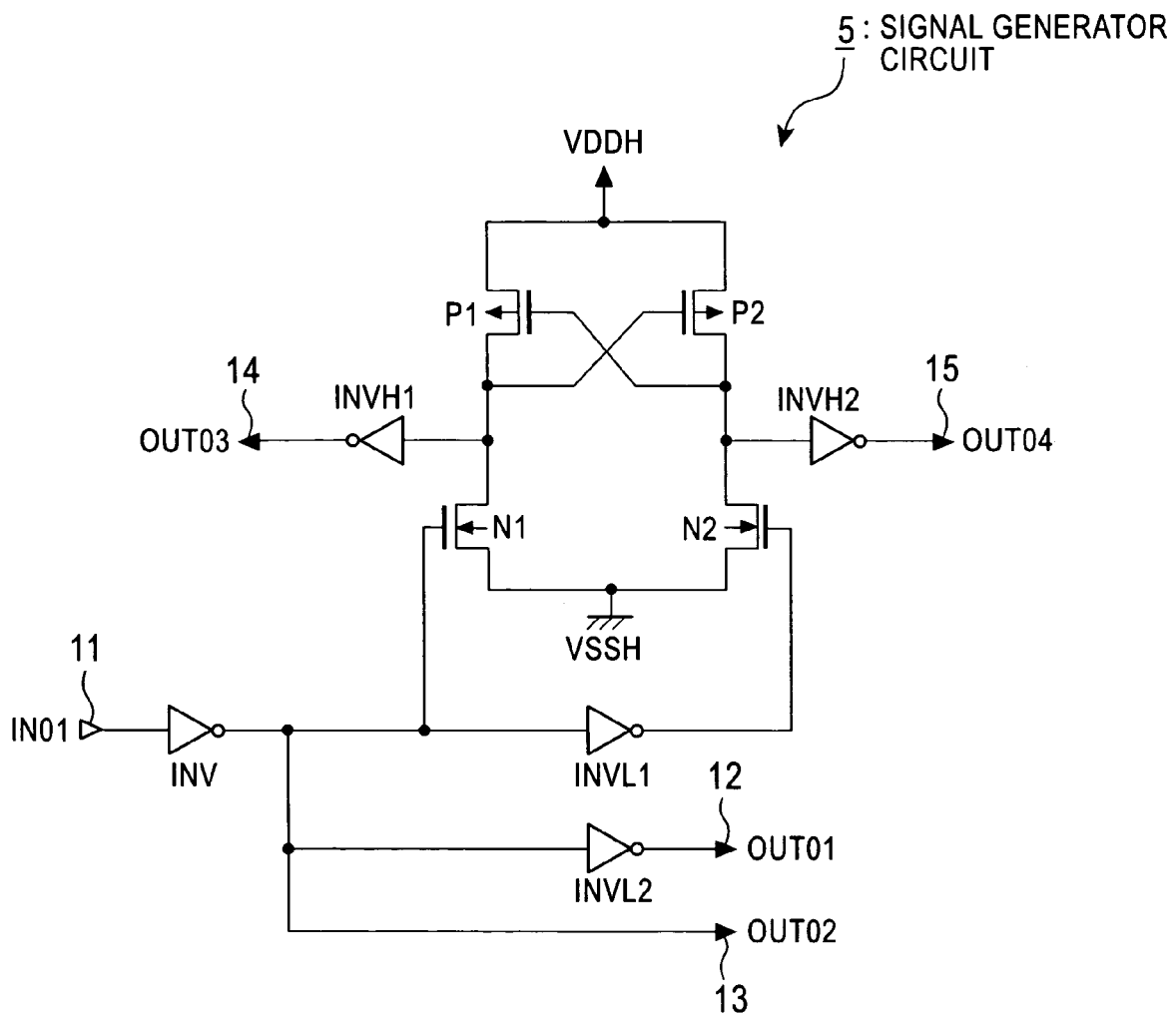
FIG. 3 is a diagram showing a conventional signal generator circuit.
Figure 4:
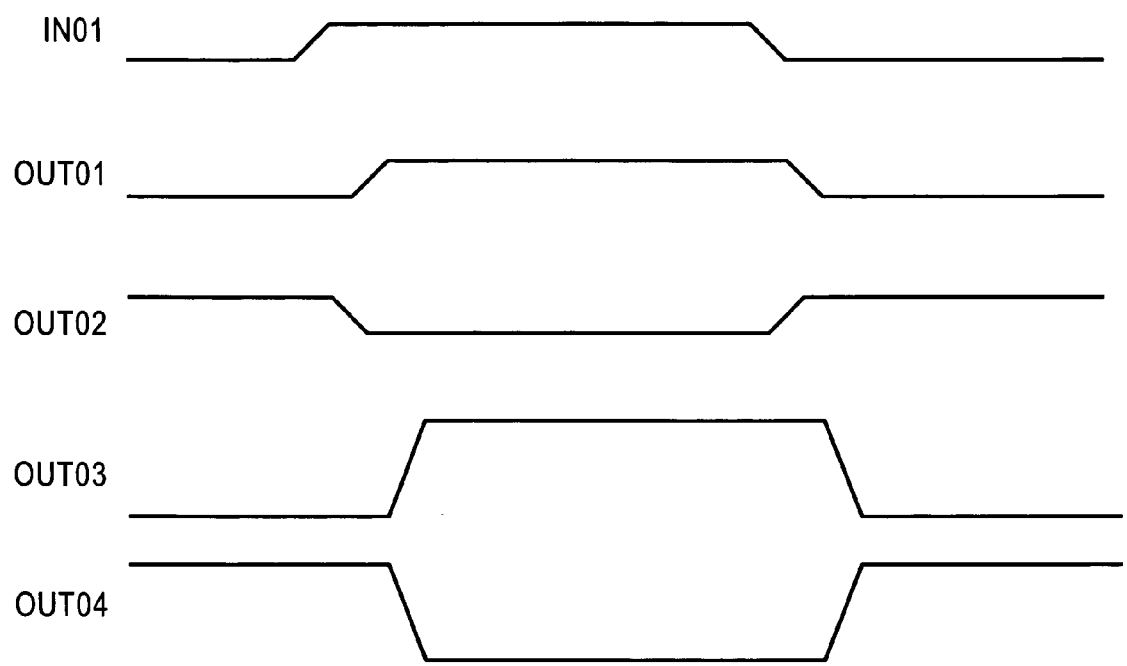
FIG. 4 is a timing chart showing the operation of the conventional signal generator circuit.
Figure 5:
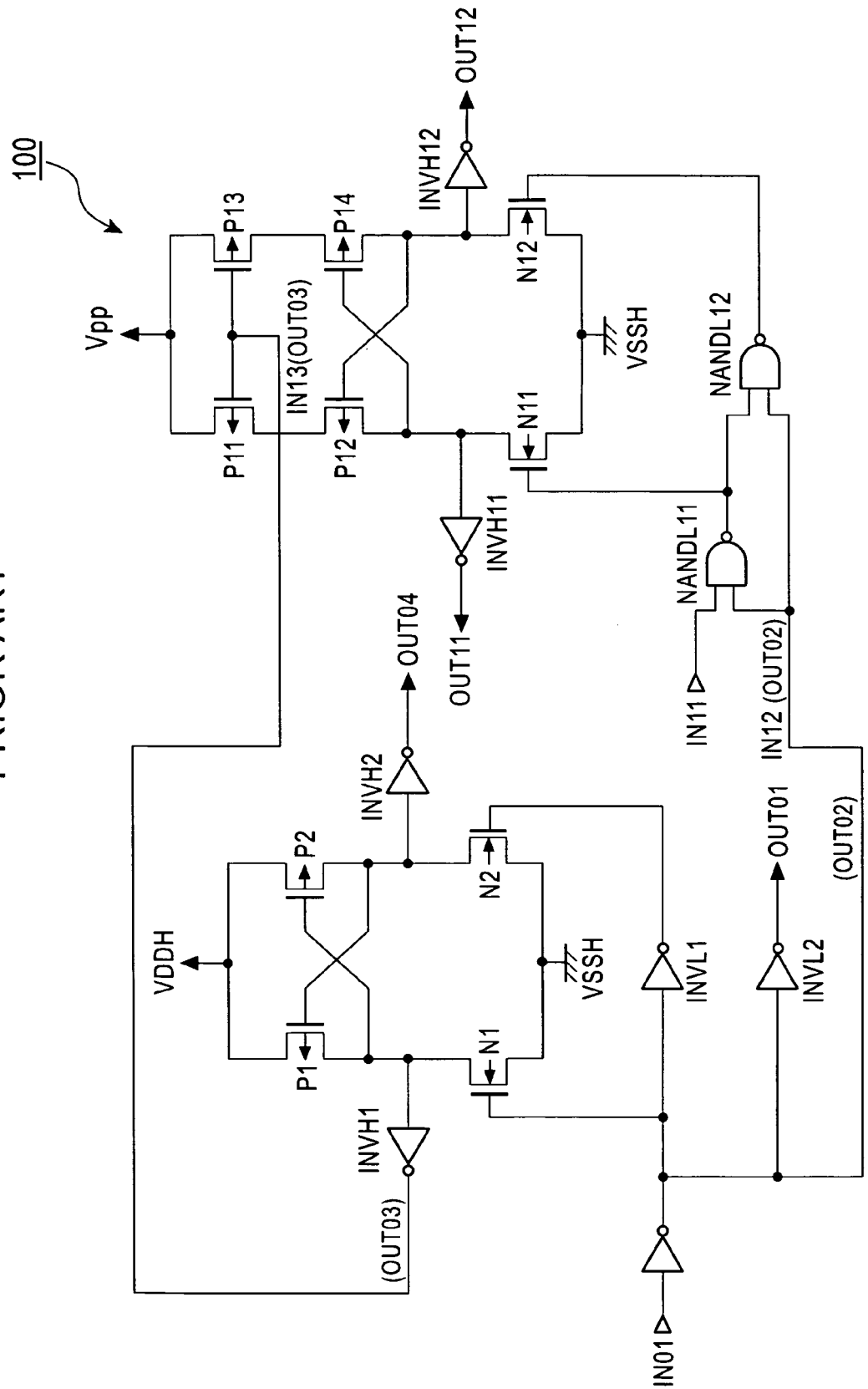
FIG. 5 is a diagram showing the configuration of a conventional level shifter having a signal generator circuit.
Figure 6:
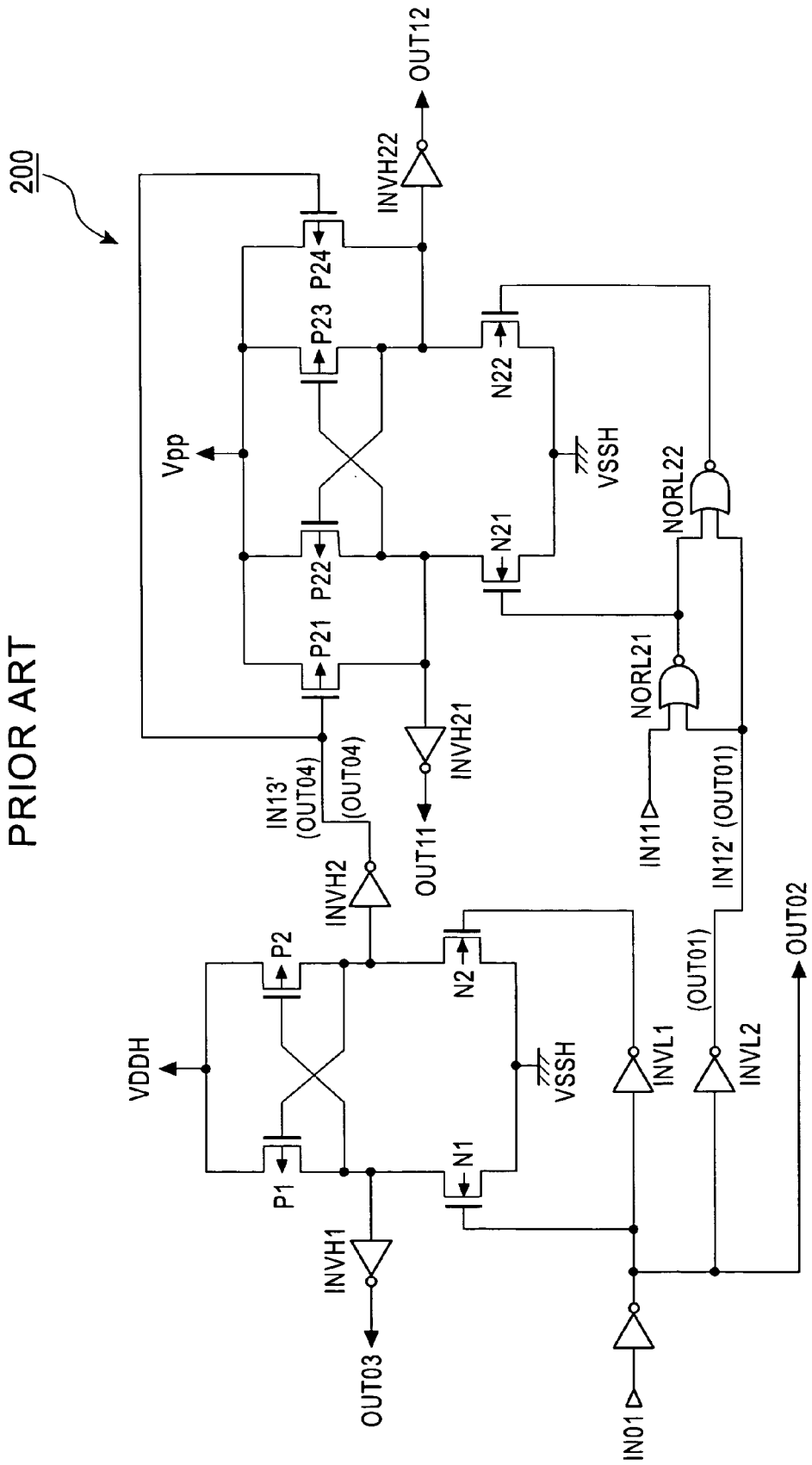
FIG. 6 is a diagram showing the configuration of a conventional level shifter having a signal generator circuit.

Even in this event, the signal applied to the one input side of the second NAND L2 still remains at "L" level with the aid of the plurality of delay elements (in FIG. 2 two DLY21–DLY22). Thus, the second output signal OUT02 outputted from the second NAND L2 still remains unchanged (i.e., remains at "H" level).

Components which finally activate are those provided with two delay elements on the input side (i.e., the first NAND L1 and second NAND L2). As a result, the signal applied to the one input side of the second NAND L2 changes from "L" level to "H" level, causing the second output signal OUT02 to change from "H" level to "L" level.

Next, description will be made on a change in each signal when the input signal IN01 changes from "H" level to "L" level.

In this event, components which activate first are those not provided with delay elements on the input side. As a result, the second output signal OUT02 outputted from the second NAND L2 first changes from "L" level to "H" level. However, a signal applied to the other input side of the first NAND 11 remains at "L" level with the aid of the plurality of delay elements (in FIG. 9, two DLY11–DLY12). Therefore, the first output signal OUT01 outputted from the first NAND L1 still remains unchanged (i.e., remains at "H" level).

Components which next activate are those provided with one delay element on the input side. As a result, the high voltage N-ch transistor N1 turns off, and the high voltage N-ch transistor N2 turns on. The gate potential of the high voltage P-ch transistor P1 changes from "H" level to "L" level by the high voltage N-ch transistor N2 turning on, so that the high voltage P-ch transistor P1 changes from off-state to on-state. Also, the gate potential of the high voltage P-ch transistor P2 changes from "L" level to "H" level by the high voltage P-ch transistor P1 turning on, so that the high voltage P-ch transistor P2 changes for on-state to off0-state. Thus, the third output signal OUT03 changes from "H" level to "L" level, and the fourth output signal OUT04 changes from "L" level to "H" level.

Likewise, in this event, the signal applied to the other input side of the first NAND 11 remains at "L" level with the aid of the plurality of delay elements (in FIG. 9, two DLY11–DLY12). Thus, the first output signal OUT01 outputted from the first NANDL1 still remains unchanged (i.e., remains at "H" level).

Components which finally activate are those provided with two delay elements on the input side (i.e., the first NAND L1 and second NAND L2). As ar result, the signal applied to the other input side of the first NAND L1 changes from "L" level to "H" level, causing the first output signal OUT01 to change from "H" level to "L" level.

As described above, according to the signal generator circuit 6 of the first embodiment, when the input signal IN01 changes from "L" level to "H" level, the first output signal OUT01 first changes from "L" level to "H" level, then the third output signal OUT03 changes from "L" level to "H" level, while the fourth output signal OUT04 changes from "H" level to "L" level, and the second output signal OUT02 finally changes from "H" level to "L" level.

On the other hand, when the input signal IN01 changes from "H" level to "L" level, the second output signal UT02 first changes from "L" level to "H" level, then the third output signal OUT03 changes from "H" level to "L" level, while the fourth output signal OUT04 changes from "L" level to "H" level, and the first output signal OUT01 finally changes from "H" level to "L" level.

Thus, the signal generator circuit 6 according to the first embodiment can shift a timing at which a change is made in a combination of the output signal at high voltage level with the output signal at low voltage level (i.e., a combination of the first output signal OUT01 with the fourth output signal OUT04, or a combination of the second output signal OUT02 with the third output signal OUT03) in accordance with a change in the input signal IN01 such that a timing at which the output signal transitions to "H" level is advanced and a timing at which the output signal transitions to "L" level is delayed.

As such, according to the first embodiment, the signal generator circuit 6 according to the first embodiment can be incorporated in the first level shifter 10, second level shifter 20, and the like to provide a level shifter having a signal generator circuit which eliminates a through current.

(Configuration of Level Shifter with Signal Generator Circuit)

The following description will be made on the configuration of the first level shifter 10 which incorporates the signal generator circuit 6 according to the first embodiment (first level shifter 106 having a signal generator circuit), and the second level shifter 20 which incorporates the signal generator circuit 6 according to the first embodiment (second level shifter 206 having a signal generator circuit).

Figure 11:
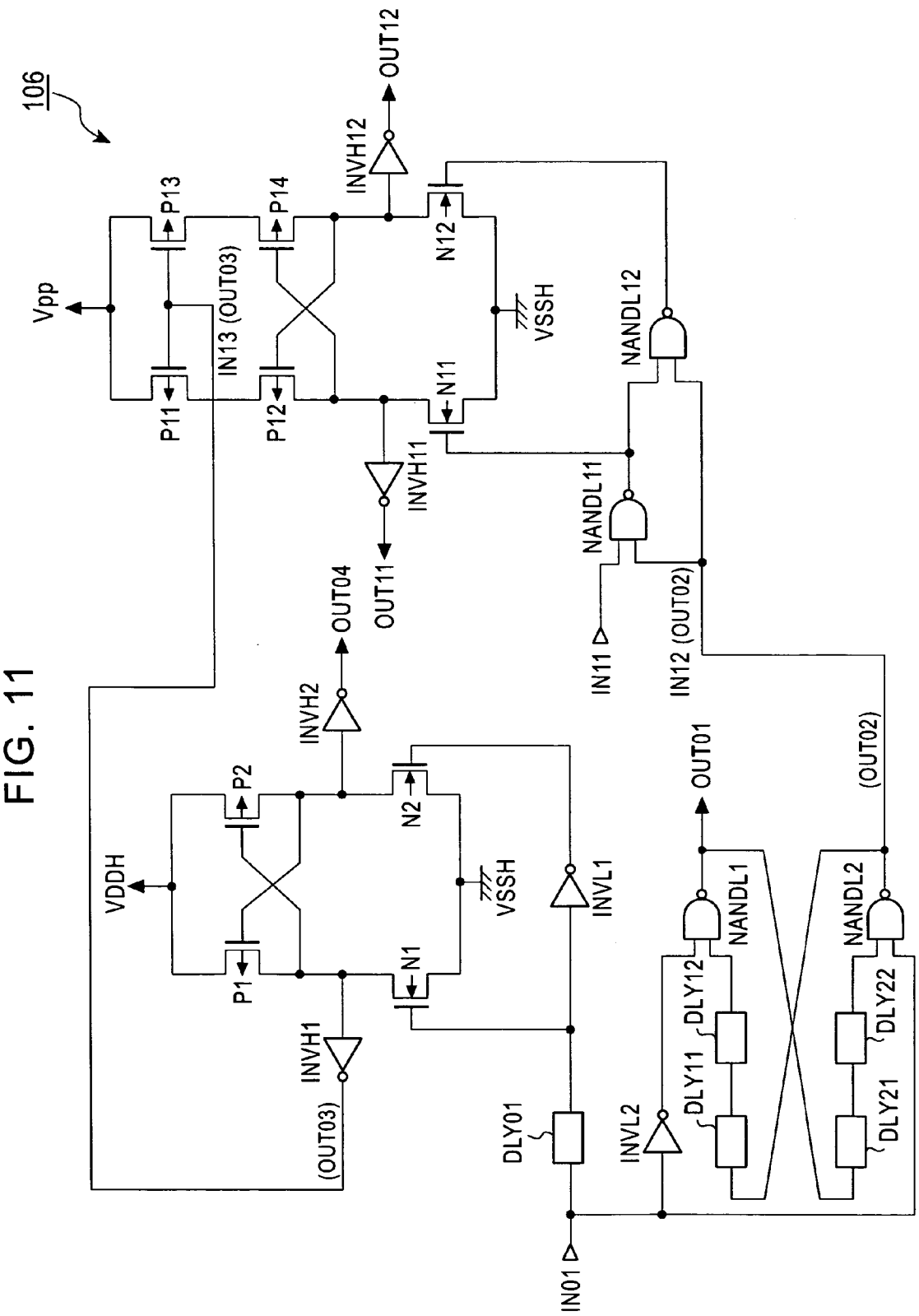
FIG. 11 is a diagram showing the configuration of a level shifter with the signal generator circuit according to the first embodiment.
Figure 13:
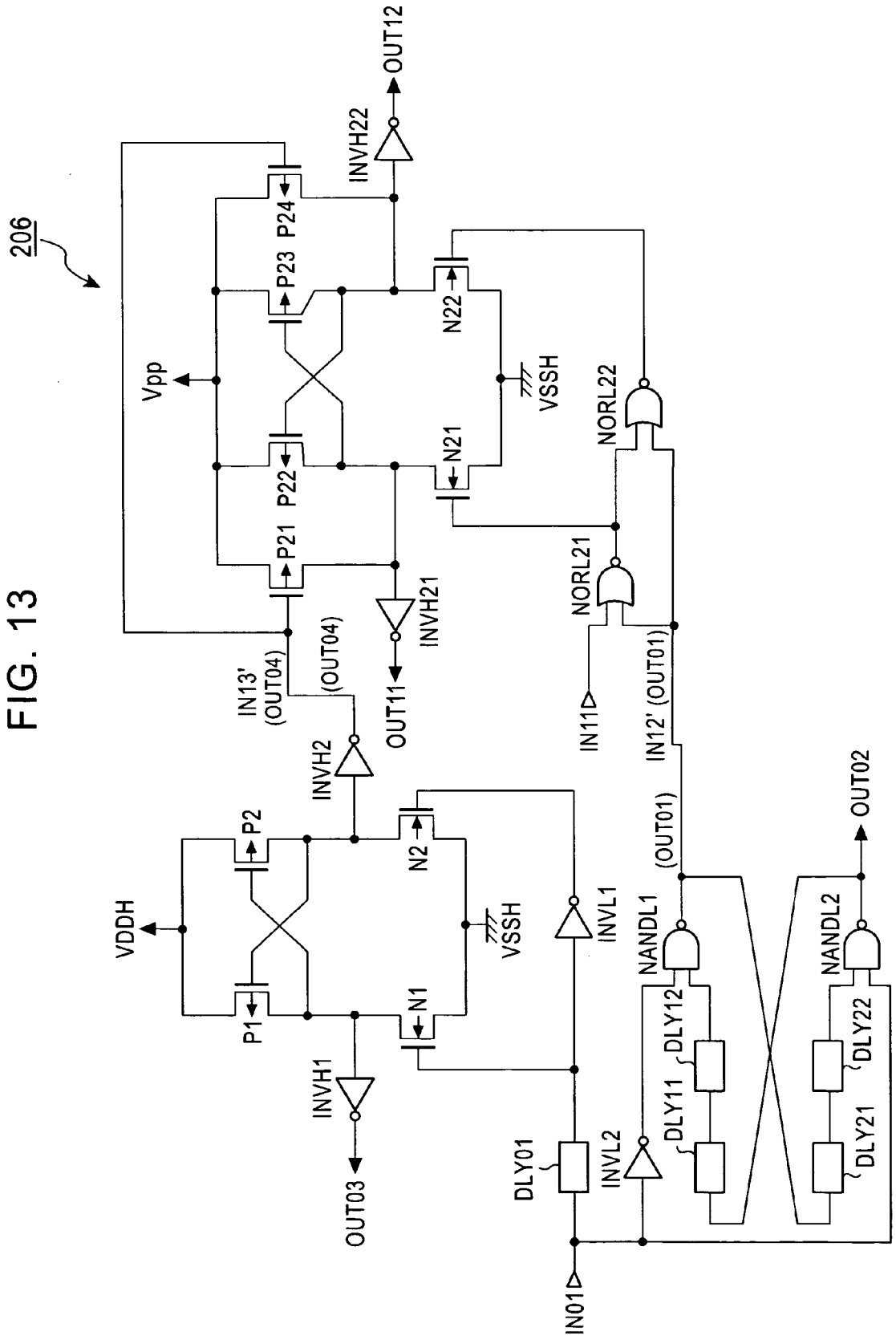
FIG. 13 is a diagram showing the configuration of the level shifter with the signal generator circuit according to the first embodiment.

FIG. 11 is a diagram showing the configuration of the first level shifter having a signal generator circuit. FIG. 13 is a diagram showing the configuration of the second level shifter having a signal generator circuit 1.

The first level shifter 106 having a signal generator circuit shown in FIG. 11 is made up of the signal generator circuit 6 according to the first embodiment and the first level shifter 10 shown in FIG. 1.

In the example shown in FIG. 11, the first level shifter 106 with the signal generator circuit employs the second output signal OUT02 of the signal generator circuit 6 as the second input signal IN12 of the first level shifter 10, and the third output signal OUT03 of the signal generator circuit 6 as the third input signal IN13 of the first level shifter 10.

Figure 16:
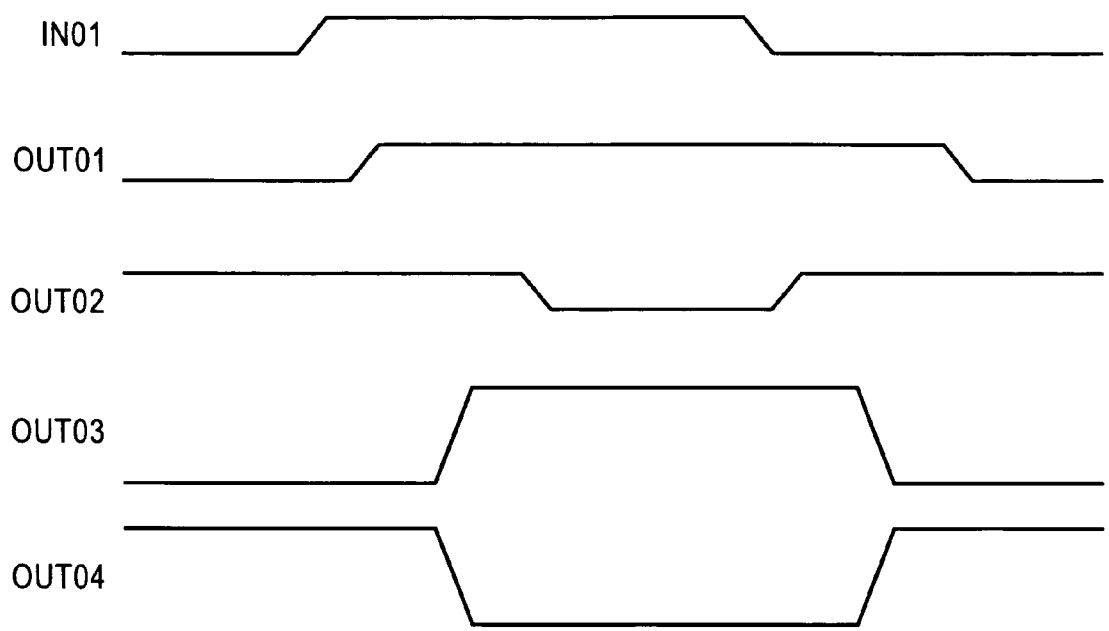
FIG. 16 is a timing chart showing the operation of the signal generator circuit according to the second embodiment.

The second level shifter 206 having a signal generator circuit shown in FIG. 13 is made up of the signal generator circuit 6 according to the first embodiment, and the second level shifter 20 shown in FIG. 16.

In the example shown in FIG. 13, the second level shifter 206 with the signal generator circuit employs the first output signal OUT01 of the signal generator circuit 6 as the second input signal IN12' of he first level shifter 10, and the fourth output signal OUT04 of the signal generator circuit 6 as the third input signal IN13' of the first level shifter 10.

The first level shifter 106 with the signal generator circuit and the second level shifter 206 with the signal generator circuit as described above each generate a combination of an output signal at high voltage level with an output signal at low voltage level of the signal generator circuit 6, wherein a timing at which the output signal transitions to "H" level is advanced, and a timing at which the output signal transitions to "L" level is delayed in accordance with a change in an input signal, and receive the combination of the output signal at high voltage level with the output signal at low voltage level of the signal generator circuit 6 as control signals, thereby making it possible to simultaneously generate complementary outputs at "H" level or "L" level.

(Operation of Level Shifter with Signal Generator Circuit)

The following description will be made on the operation of the first level shifter 106 with the signal generator circuit and the second level shifter 206 with the signal generator circuit.

Figure 12:
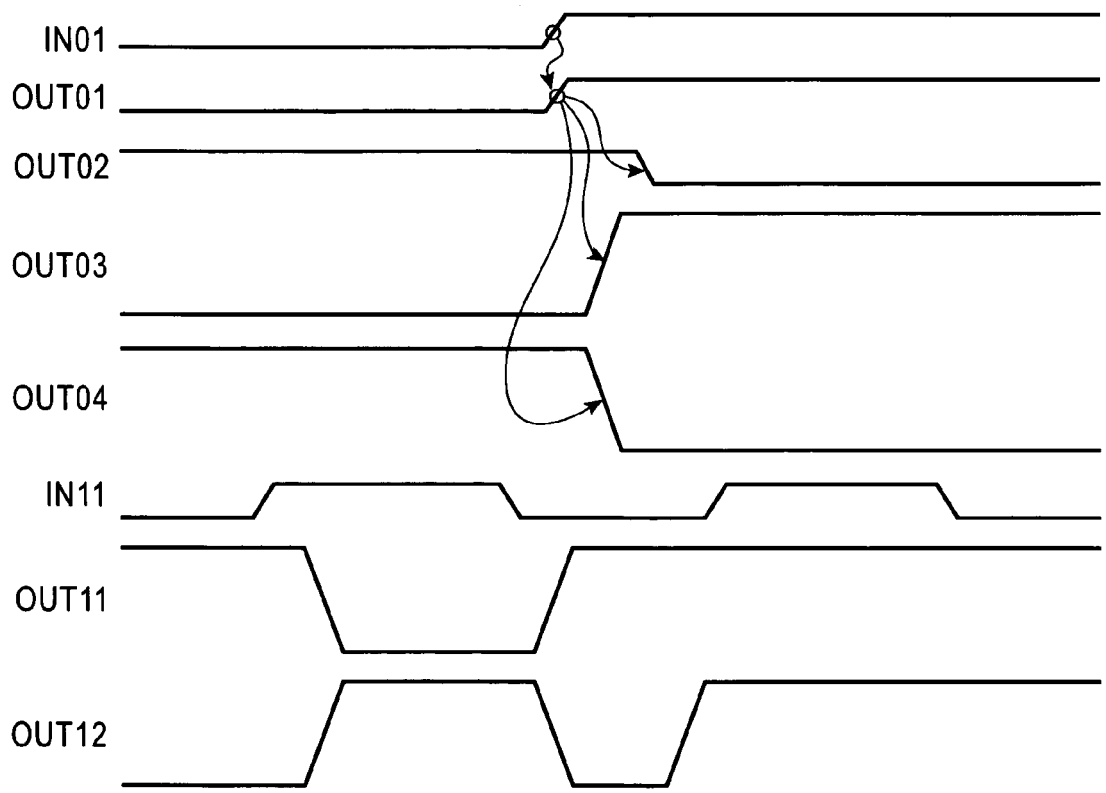
FIG. 12 is a timing chart showing the operation of the level shifter with the signal generator circuit according to the first embodiment.
Figure 14:
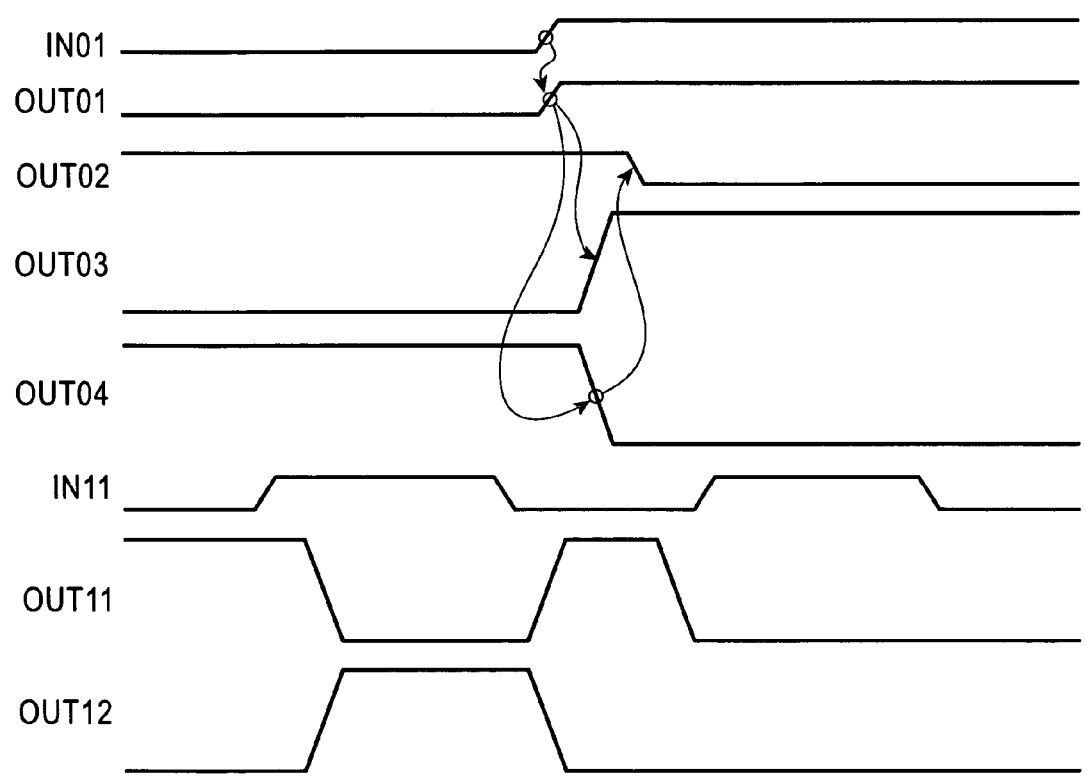
FIG. 14 is a timing chart showing the operation of the level shifter with the signal generator circuit according to the first embodiment.

FIG. 12 is a timing chart showing the operation of the first level shifter with the signal generator circuit. FIG. 14 is a timing chart showing the operation of the second level shifter with the signal generator circuit.

As shown in FIG. 12, the operation of the first level shifter 106 with the signal generator circuit is such that when the input signal IN01 changes from "L" level to "H" level, the first output signal OUT01 changes from "L" level to "H" level, then the third output signal OUT03 changes from "L" level to "H" level, while the fourth output signal OUT04 changes from "H" level to "L" level, and the second output signal OUT02 finally changes from "H" level to "L" level.

Though not shown, when the input signal IN01 changes from "H" level to "L" level, the operation of the level shifter 106 with the signal generator circuit is such that the second output signal OUT02 first changes from "L" level to "H" level, then the third output signal OUT03 changes from "H" level to "L" level, while the fourth output signal OUT04 changes from "L" level to "H" level, and the first output signal OUT01 finally changes from "H" level to "L" level.

In this way, the first signal generator circuit 6 relies on the effects of the plurality of delay elements DLY11–DLY12, DLY21–DLY22 to change the second output signal OUT02 later than the other output signals (i.e., the first output signal OUT01, third output signal OUT03, and fourth output signal OUT04). Consequently, the first level shifter 106 with the signal generator circuit 106 can prevent a through current from occurring, thereby operating with stability.

On the other hand, as shown in FIG. 14, the operation of the second level shifter 206 with the signal generator circuit is such that when the input signal IN01 changes from "L" level to "H" level, the first output signal OUT01 first changes from "L" level to "H" level, then the third output signal OUT03 changes from "L" level to "H" level, while the fourth output signal OUT04 changes from "H" level to "L" level, and the second output signal OUT02 finally changes from "H" level to "L" level.

Though not shown, when the input signal IN01 changes from "H" level to "L" level, the operation of the second level shifter 206 with the signal generator circuit is such that the second output signal OUT02 first changes from "L" level to "H" level, then the third output signal OUT03 changes from "H" level to "L" level, while the fourth output signal OUT04 changes from "L" level to "H" level, and the first output signal OUT01 finally changes from "H" level to "L" level.

In this way, the first signal generator circuit 6 relies on the effects of the plurality of delay elements DLY11–DLY12, DLY21–DLY22 to change the second output signal OUT02 later than the other output signals (i.e., the first output signal OUT01, third output signal OUT03, and fourth output signal OUT04), such that the second output signal OUT02 does not overlap with the other signals. Consequently, the second level shifter 206 with the signal generator circuit can prevent a through current from occurring, thereby operating with stability.

In this way, the first level shifter 106 with the signal generator circuit or the second level shifter 206 with the signal generator circuit is applied with control signals which comprise a combination of an output signal at high voltage level with an output signal at low voltage level (i.e., a combination of the first output signal OUT01 with the fourth output signal OUT04, or a combination of the second output signal OUT02 with the third output signal OUT03), wherein the a timing at which the output signal transitions to "H" level is advanced, while a timing at which the output signal transitions to "L" level is delayed in accordance with a change in the input signal IN01, so that a through current can be prevented from occurring.

SECOND EMBODIMENT (Configuration of Signal Generator Circuit)

Since the signal generator circuit 6 according to the first embodiment employs the delay elements DLY11–DLY12, DLY21–DLY21, it is necessary to adjust operating speeds of the delay elements DLY11–DLY12, DLY21—DLY21 and the level shifter unit, but the adjustment is difficult. To eliminate this difficulty, a second embodiment provides a signal generator circuit which does not employ the delay elements DLY11–DLY12, DLY21—DLY21.

Figure 15:
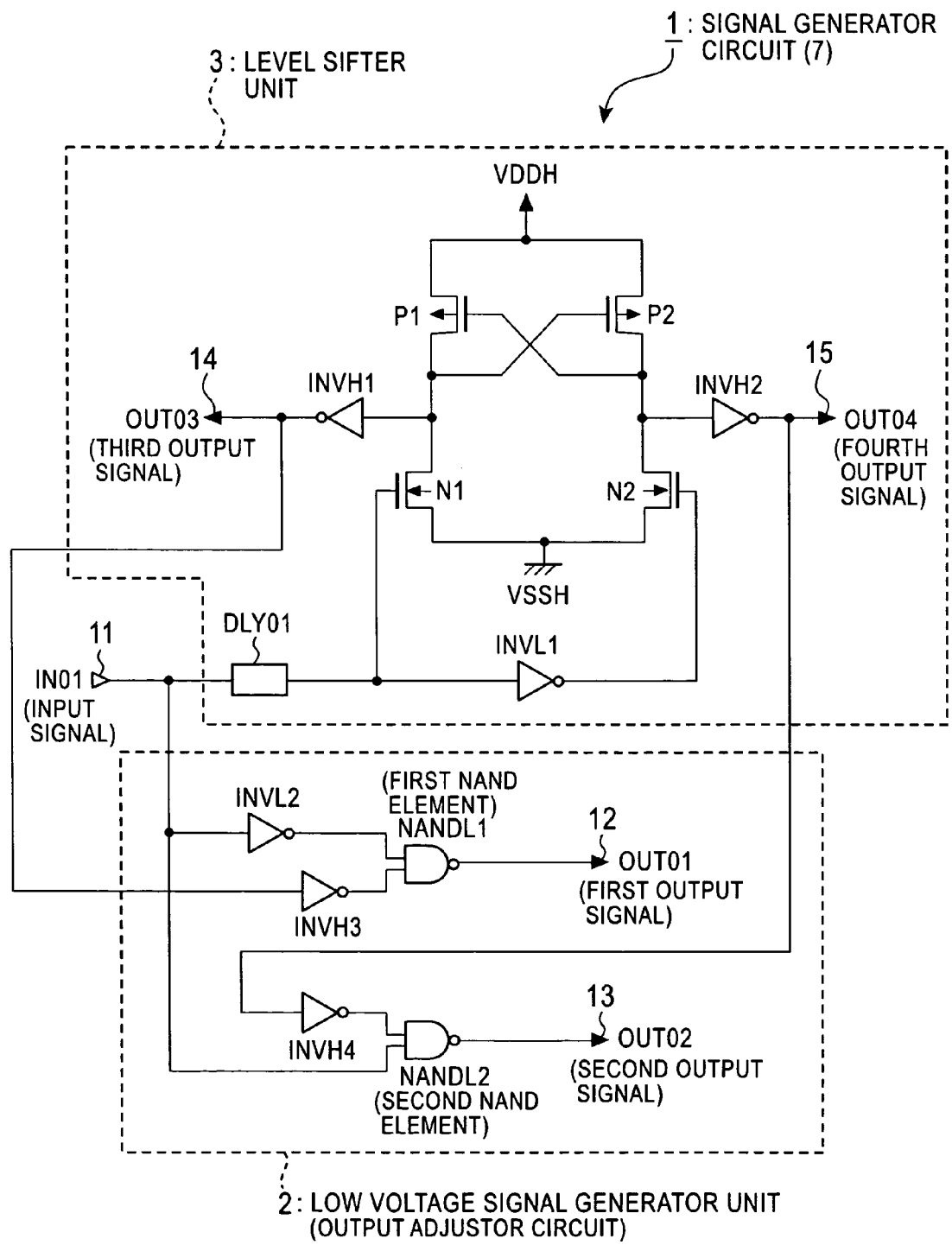
FIG. 15 is a diagram showing the configuration of a signal generator circuit according to a second embodiment.

The following description will be made on the specific configuration of a signal generator circuit 7 according to the second embodiment of the present invention. FIG. 15 is a diagram showing the configuration of the signal generator circuit according to the second embodiment.

As shown in FIG. 15, the signal generator circuit 7 comprises an input terminal 11 for receiving an input signal IN01; an output terminal 12 for outputting a first output signal OUT01; an output terminal 13 for outputting a second output signal OUT02; a second low voltage inverter INVL2; a third high voltage inverter INVH3; a fourth high voltage inverter INVH4; a first low voltage NAND element NAND L1 (first NAND L1); and a second low voltage NAND element NAND L2 (second NAND L2). These components form a low voltage signal generator unit (output adjustor circuit) 2 for generating signals at low voltage level.

The signal generator circuit 7 branches the input signal IN01 applied from the input terminal 11 into three, one of which is outputted to one end of a delay element DLY01, one of which is outputted to the input side of the second low voltage inverter INVL2, and one of which is outputted to the other input side of the second NAND L2.

The delay element DLY01 has one end connected to the input terminal 11 for receiving the input signal IN01, and the other terminal connected to the input side of a first low voltage inverter INVL1 and to a gate of a high voltage N-ch transistor N1. The output side of the first INVL1 is connected to a gate of a high voltage N-ch transistor N2.

The second low voltage inverter INVL2 has one end connected to the input terminal 11 for receiving the input signal IN01, and the other end connected to one input side of the first NAND L1. The first NAND L1 has the one input side connected to the input terminal 11 for receiving the input signal IN01 through the second low voltage inverter INVL2, and the other input side branched for connection to a line which connects the output side of the first high voltage inverter INVH1 with the third output terminal 14 through the third high voltage inverter INVH3. Then, the first NAND L1 is applied with an inverted version of the input signal IN01 and the third output signal OUT03.

The second NAND L2 has one input side branched for connection to a line which connects the output side of the second high voltage inverter INVH2 with the fourth output terminal 15 through the fourth high voltage inverter INVH4, and the other input side connected to the input terminal 11 for receiving the input signal IN01. Then, the second NAND L2 is applied with the input signal IN01 and an inverted version of the fourth output signal OUT04.

The signal generator circuit 7 as described above is configured to output the first and second output signals OUT01, OUT02 based on the third and fourth output signals OUT03, OUT04. The signal generator circuit 7 is also configured to generate the first output signal OUT01 in accordance with the input signal IN01 and third output signal OUT03. Further, the signal generator circuit 7 generates the second output signal OUT02 in accordance with the input signal IN01 and fourth output signal OUT04.

The signal generator circuit 7 also comprises an output terminal 14 for outputting the third output signal OUT03; an output terminal 15 for outputting the fourth output signal OUT04; the delay element DLY01; the first low voltage inverter INVL1; a high voltage power supply VDDH; and a ground potential VSSH. Disposed between the high voltage poser supply VDDH and the ground potential VSSH are a circuit comprised of a high voltage P-ch transistor P1, the high voltage inverter INVH1, the first output terminal 14, and the high voltage N-ch transistor N1; and a circuit comprised of a high voltage P-ch transistor P2; the high voltage inverter INVH2, the second output terminal 15, and the high voltage N-ch transistor N2. These components form a level shifter unit 3. The high voltage P-ch transistors P1, P2 have their sources commonly connected to the high voltage power supply VDDH. The high voltage P-ch transistor P1 has a gate branched for connection to a line which connects a drain of the high voltage P-ch transistor P2 with a drain of the high voltage N-ch Transistor N2, and a drain connected to a drain of the high voltage N-ch transistor N2. The high voltage P-ch transistor P2 has a gate branched for connection to a line which connects the drain of the high voltage P-ch transistor P1 with the drain of the high voltage N-ch transistor N1, and the drain connected to the drain of the high voltage N-ch transistor N2. The high voltage P-ch transistors P1, P2 form a flip-flop circuit through the foregoing connections. The high voltage N-ch transistor N1 has a source connected to the ground potential VSSH, the gate branched for connection to a line which connects the other end of the delay element DLY01 with the input side of the first low voltage inverter INVL1, and the drain connected to the drain of the high voltage P-ch transistor P1. The high voltage N-ch transistor N2 has a source connected to the ground potential VSSH, the gate connected to the output side of the first low voltage inverter INVL1, and the drain connected to the drain of the high voltage P-ch transistor P2. The output terminal 14 for outputting the third output signal OUT03 is branched for connection to a line which connects the drain of the high voltage P-ch transistor P1 with the drain of the high voltage N-ch transistor N1 through the high voltage inverter INVH1, and is also connected to the input side of the high voltage INVH3. The output terminal 15 for outputting the fourth output signal OUT04 is branched for connection to a line which connects the drain of the high voltage P-ch transistor P2 with the drain of the high voltage N-ch transistor N2 through the high voltage inverter INVH2, and is also connected to the input side of the fourth high voltage INVH4.

The signal generator circuit 7 shown in FIG. 15 is identical in basic configuration to the signal generator circuit 6 according to the first embodiment. The signal generator circuit 6 according to the first embodiment differs from the signal generator circuit 7 according to the second embodiment in the following aspects.

First, the signal generator circuit 6 according to the first embodiment employs the second output signal OUT02 through the delay elements DLY11–DLY12 as a monitor for the other input of the first NAND L1. On the other hand, the signal generator circuit 7 according to the second embodiment employs the third output signal OUT03, which is an output signal of the level shifter unit, as a monitor for the other input of the first NAND L1.

Second, the signal generator circuit 6 according to the first embodiment employs the first output signal OUT01 through the delay elements DLY21–DLY22 as a monitor for the one input of the second NAND L2. On the other hand, the signal generator circuit 7 according to the second embodiment employs the fourth output signal OUT04, which is an output signal of the level shifter unit, as a monitor for the one input side of the second NAND L2.

The signal generator circuit 7 according to the second embodiment is configured to employ an output signal of the level shifter unit, which is a signal at high voltage level, as a monitor to provide output signals at low voltage level from the first NAND L1 and second NAND L2. Therefore, in order to prevent broken gate films of the first NAND L1 and second NAND L2, which are low voltage NAND elements, high voltage elements are employed for the high voltage inverter INVH3 for receiving the third output signal OUT03 and the high voltage inverter INVH4 for receiving the fourth output signal OUT04, and a low voltage power supply is employed for the power supply.

The signal generator circuit 7 according to the second embodiment forces the level shifter unit to generate an output signal at high voltage level as a delayed version of the input signal IN01. Also, by using an output signal at high voltage level on one input side of the NAND gate cross-connected in RS-FF as a monitor, an output signal at low voltage level is generated. The signal generator circuit 6 as described shifts a timing to generate a combination of an output signal at high voltage level with an output signal at low voltage level in accordance with a change in the input signal IN01 such that a timing at which the output signal transitions to "H" level is advanced, while a timing at which the output signal transitions to "L" level is delayed.

(Operation of the Signal Generator Circuit)

The following description will be made on the operation of the signal generator according to the second embodiment of the present invention. FIG. 16 is a timing chart showing the operation of the signal generator circuit according to the second embodiment.

In an initial state, the input signal IN01 at "L" level is applied to the signal generator circuit 7 from the input terminal 11. In this event, since the second NAND L2 receives the input signal IN01 at "L" level on the other input side, the second NAND L2 outputs the output signal OUT02 at "H" level.

Since the high voltage N-ch transistor N1 receives the input signal IN01 at "L" level at the gate through the delay element DLY01, the high voltage N-ch transistor N1 turns off. On the other hand, the high voltage N-ch transistor N2 turns on because it receives a signal at "H" level, which is the inverse of the input signal IN01 at "L" level, at the gate through the delay element DLY01 and first low voltage inverter INVL1. The high voltage P-ch transistor P1 turns on because the high voltage N-ch transistor N2 turns on and the high voltage P-ch transistor P1 receives a signal at "L" level at the gate. On the other hand, the high voltage P-ch transistor P2 turns off because the high voltage N-ch transistor N1 turns off and the high voltage P-ch transistor P2 receives a signal at "H" level at the gate. Thus, the potential between the drain of the high voltage P-ch transistor P1 and the drain of the high voltage N-ch transistor N1 is at "H" level, while the potential between the drain of the high voltage P-ch transistor P2 and the drain of the high voltage N-ch transistor N2 is at "L" level. As a result, the third output signal OUT03 is a signal at "L" level, which is the inverse of the signal at "H" level, generated by the first high voltage inverter INVH1. The fourth output signal OUT04 in turn is a signal at "H" level, which is the inverse of the signal at "L" level, generated by the second high voltage inverter INVH2.

The first NAND L1 is applied with a signal at "H" level, which is the inverse of the input signal IN)1 at "L" level, on one input side through the second low voltage inverter INVL2. The first NAND L1 is also applied with a signal at "H" level, which is the inverse of the third output signal OUT03 at "L" level, on the other input side through the third high voltage inverter INVH3. Consequently, the first NAND L1 outputs the first output signal OUT01 at "L" level.

Thus, when the signal generator circuit 7 is applied with the input signal IN01 at "L" level from the input terminal 11, the signal generator circuit 7 outputs the first output signal OUT01 at "L" level from the output terminal 12; outputs the second output signal OUT02 at "H" level from the output terminal 13; outputs the third output signal OUT03 at "L" level from the output terminal 14; and outputs the fourth output signal OUT04 at "H" level from the output terminal 15.

Next, description will be made on a change in each signal when the input signal IN01 changes from "L" level to "H" level.

In this event, components which first activate are those not provided with a delay element on the input side, As a result, the output signal of the second low voltage inverter INVL2 changes from "H" level to "L" level. This causes the first output signal OUT01 outputted from the first NAND L1 to change from "L" level to "H" level.

In this event, the signal applied to the one input side of the second NAND L2 remains at "L" level because it is monitoring the inverted version of the fourth output signal OUT04 which is the output signal of the level shifter unit. Thus, the second output signal OUT02 outputted from the second NAND L2 still remains unchanged (i.e., remains at "H" level).

Components which next activate are those provided with one delay element on the input side. As a result, the level shifter unit changes, causing the high voltage N-ch transistor N1 to turn on, and the high voltage N-ch transistor N2 to turn off. Since the gate potential of the high voltage P-ch transistor P2 changes from "H" level to "L" level by the high voltage N-ch transistor N1 turning on, the high voltage P-ch transistor P2 changes from off-state to on-state. Since the gate potential of the high voltage P-ch transistor P1 changes from "L" level to "H" level by the high voltage P-ch transistor P2 turning on, the high voltage P-ch transistor P1 changes from on-state to off-state. Thus, the third output signal OUT03 changes from "L" level to "H" level, while the fourth signal OUT04 changes from "H" level to "L" level. As the fourth output signal OUT04 changes to "L" level, the second NAND L2 is applied on one input side with "H" level which is the inverse of the fourth output signal OUT04 at "L" level. As a result, the second output signal OUT02 changes from "H" level to "L" level.

Next, description will be made on a change in each signal when the input signal IN01 changes from "H" level to "L" level.

First, the second output signal OUT02 outputted from the second NAND L2 changes from "L" level to "H" level.

In this event, a signal applied to one input side of the first NAND L1 remains at "L" level because it is monitoring the inverted version of the third output signal OUT03 which is an output signal of the level shifter unit. Thus, the first output signal OUT01 outputted from the first NAND L1 still remains unchanged (i.e., remains at "H" level).

Next, the level shifter unit, affected by the delay elements, changes with delay. As a result, the level shifter changes, causing the high voltage N-ch transistor to turn off, and the high voltage N-ch transistor N2 to turn on. Since the gate potential of the high voltage P-ch transistor P1 changes from "H" level to "L" level by the high voltage N-ch transistor N2 turning on, the high voltage P-ch transistor P1 changes from off-state to on-state. Since the gate potential of the high voltage P-ch transistor P2 changes from "L" level to "H" level by the high voltage P-ch transistor P1 turning on, the high voltage P-ch transistor P2 changes from on-state to off-state. Thus, the third output signal OUT03 changes from "H" level to "L" level, while the fourth signal OUT04 changes from "L" level to "H" level. As the third output signal OUT03 changes to "L" level, the first NAND L1 is applied on one input side with "H" level which is the inverse of the third output signal OUT03 at "L" level. As a result, the first output signal OUT01 changes from "H" level to "L" level.

As described above, according to the signal generator circuit 7 of the second embodiment, an order in which the level changes can be determined in the order of the first output signal OUT01 and second output signal OUT02, third output signal OUT03, and fourth output signal OUT04 by monitoring (inverted versions of) the third output signal OUT03 and fourth output signal OUT04. The signal generator circuit 6 according to the first embodiment requires adjustments of the operating speeds for the delay elements DLY11–DLY12, DLY12–DLY22 and the level shifter unit due to the use of the delay elements DLY11–DLY12, DLY12–DLY22 and encounters difficulties in the adjustments, whereas the signal generator circuit 7 according to the second embodiment can advantageously eliminate such adjustments of the operating speeds.

Also, according to the second embodiment, the signal generator circuit 7 according to the second embodiment can be incorporated in the first level shifter 10, second level shifter 20, and the like to provide a level shifter having a signal generator circuit which eliminates a through current, in a manner similar to the first embodiment.

(Configuration of Level Shifter with Signal Generator Circuit)

The following description will be made on the configuration of the first level shifter 10 which incorporates the signal generator circuit 7 according to the second embodiment (first level shifter 107 having a signal generator circuit), and the second level shifter 20 which incorporates the signal generator circuit 7 according to the second embodiment (second level shifter 207 having a signal generator circuit).

Figure 17:
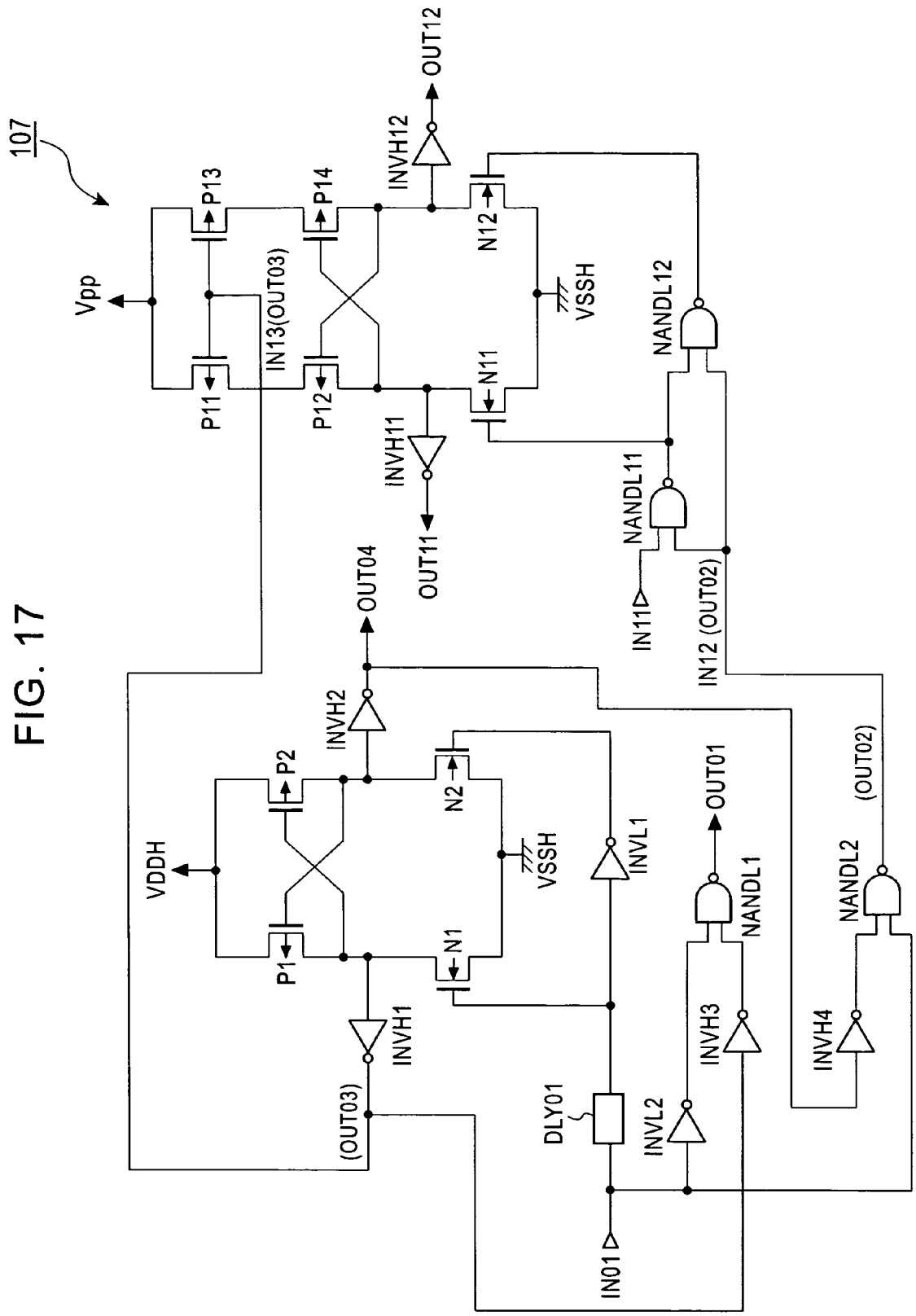
FIG. 17 is a diagram showing the configuration of a level shifter with the signal generator circuit according to the second embodiment.
Figure 19:
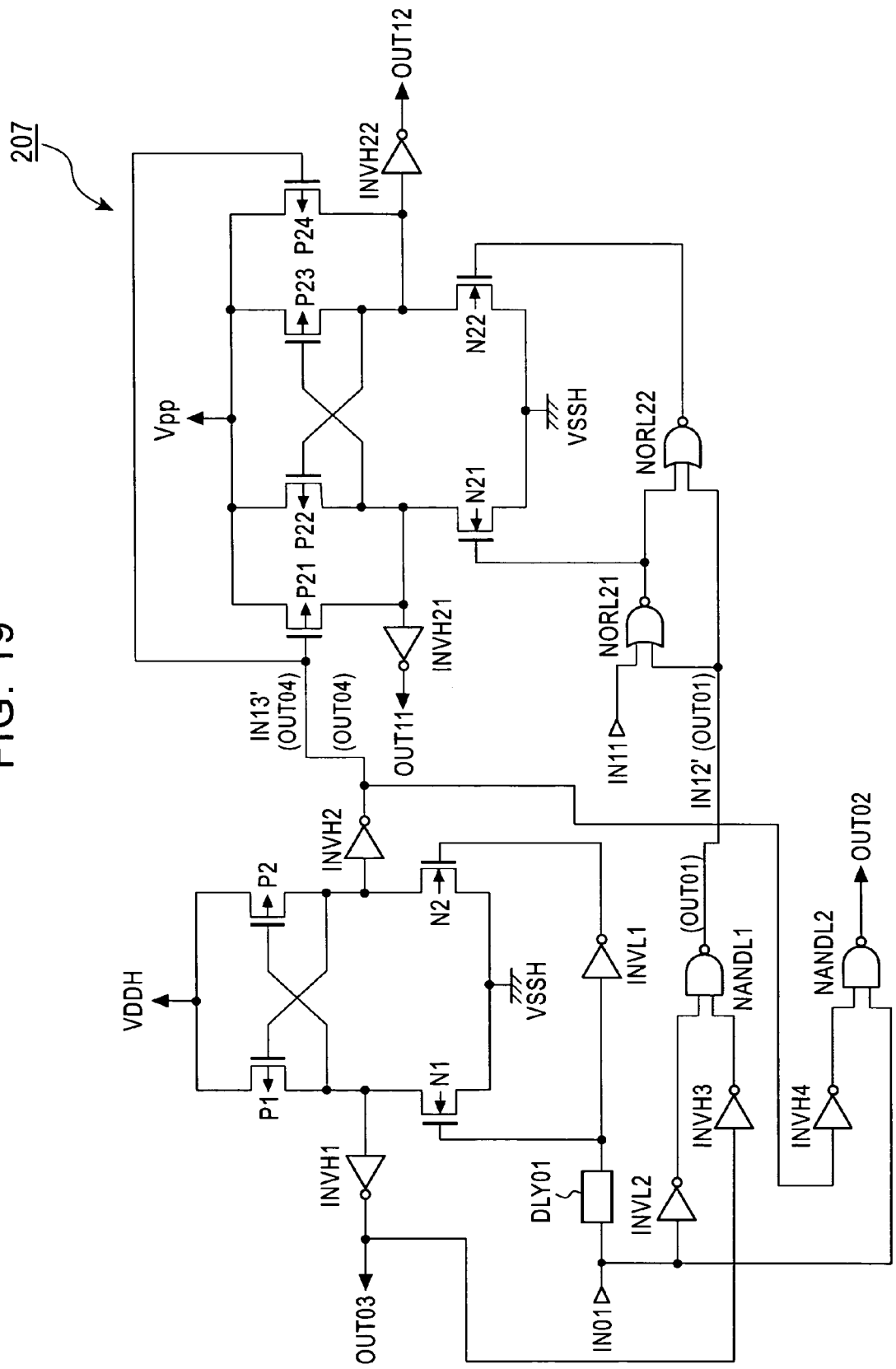
FIG. 19 is a diagram showing the configuration of the level shifter with the signal generator circuit according to the second embodiment.

FIG. 17 is a diagram showing the configuration of the first level shifter having a signal generator circuit. FIG. 19 is a diagram showing the configuration of the second level shifter having a signal generator circuit 1.

The first level shifter 107 having a signal generator circuit shown in FIG. 17 is made up of the signal generator circuit 7 according to the second embodiment and the first level shifter 10 shown in FIG. 15.

In the example shown in FIG. 17, the first level shifter 107 with the signal generator circuit employs the second output signal OUT02 of the signal generator circuit 7 as the second input signal IN12 of the first level shifter 10, and the third output signal OUT03 of the signal generator circuit 7 as the third input signal IN13 of the first level shifter 10.

The second level shifter 207 having a signal generator circuit shown in FIG. 19 is made up of the signal generator circuit 7 according to the second embodiment, and the second level shifter 20 shown in FIG. 2.

In the example shown in FIG. 19, the second level shifter 207 with the signal generator circuit employs the first output signal OUT01 of the signal generator circuit 7 as the second input signal IN12' of he first level shifter 10, and the fourth output signal OUT04 of the signal generator circuit 7 as the third input signal IN13' of the first level shifter 10.

The first level shifter 107 with the signal generator circuit and the second level shifter 207 with the signal generator circuit as described above each force the signal generator circuit 7 to generate a combination of an output signal at high voltage level with an output signal at low voltage level of the signal generator circuit 7, wherein a timing at which the output signal transitions to "H" level is advanced, and a timing at which the output signal transitions to "L" level is delayed in accordance with a change in an input signal, and receive the combination of the output signal at high voltage level with the output signal at low voltage level of the signal generator circuit 7 as control signals, thereby making it possible to simultaneously generate complementary outputs at "H" level or "L" level.

(Operation of Level Shifter with Signal Generator Circuit)

The following description will be made on the operation of the first level shifter 107 with the signal generator circuit and the second level shifter 207 with the signal generator circuit.

Figure 18:
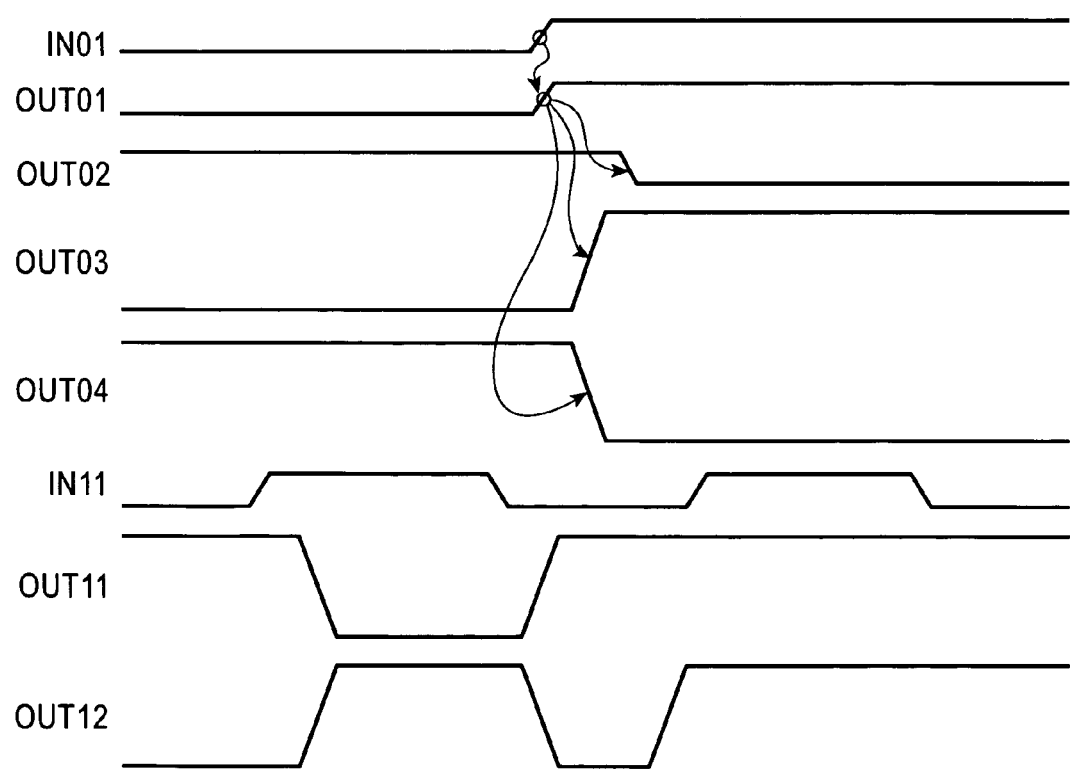
FIG. 18 is a timing chart showing the operation of the level shifter with the signal generator circuit according to the second embodiment.
Figure 20:
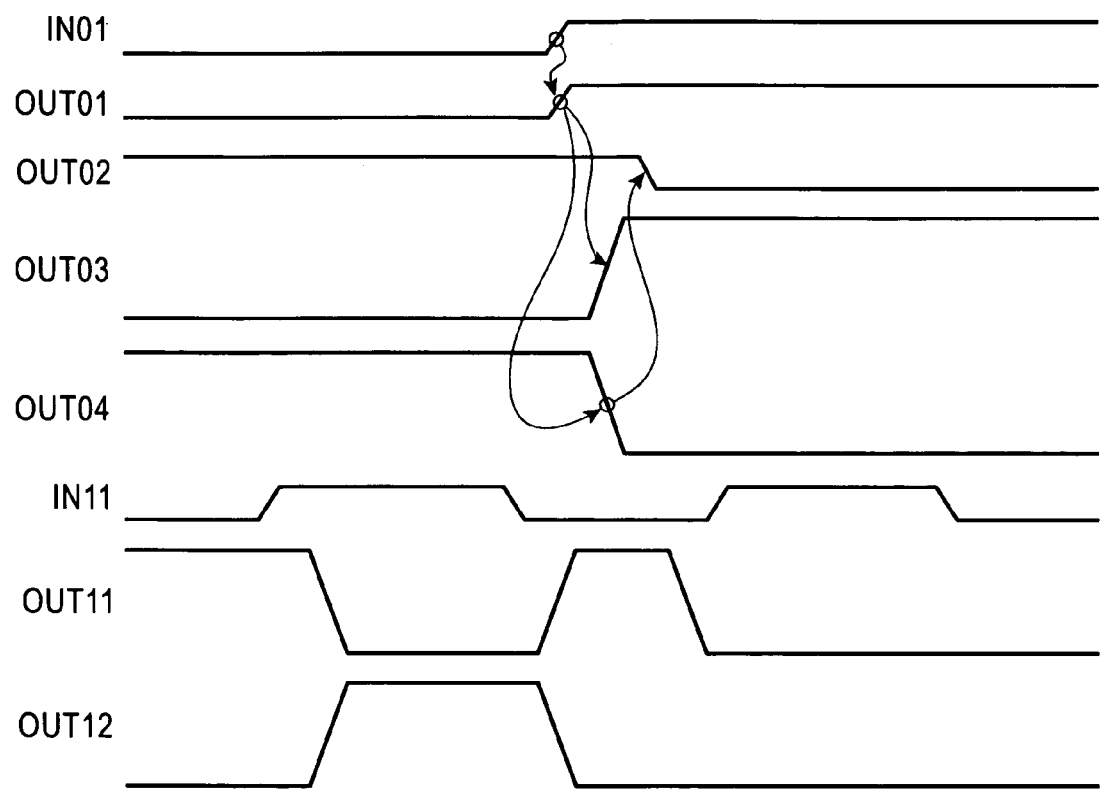
FIG. 20 is a timing chart showing the operation of the level shifter with the signal generator circuit according to the second embodiment.

FIG. 18 is a timing chart showing the operation of the first level shifter with the signal generator circuit. FIG. 20 is a timing chart showing the operation of the second level shifter with the signal generator circuit.

The first level shifter 106 with the signal generator circuit shown in FIG. 17 operates such that when the input signal IN01 changes from "L" level to "H" level, the first output signal OUT01 changes from "L" level to "H" level, then the third output signal OUT03 changes from "L" level to "H" level, while the fourth output signal OUT04 changes from "H" level to "L" level, and the second output signal OUT02 finally changes from "H" level to "L" level.

Though not shown, when the input signal IN01 changes from "H" level to "L" level, the level shifter 106 with the signal generator circuit operates such that the second output signal OUT02 first changes from "L" level to "H" level, then the third output signal OUT03 changes from "H" level to "L" level, while the fourth output signal OUT04 changes from "L" level to "H" level, and the first output signal OUT01 finally changes from "H" level to "L" level.

The second level shifter 207 with the signal generator circuit shown in FIG. 19 operates such that when the input signal IN01 changes from "L" level to "H" level, the first output signal OUT01 first changes from "L" level to "H" level, then the third output signal OUT03 changes from "L" level to "H" level, while the fourth output signal OUT04 changes from "H" level to "L" level, and the second output signal OUT02 finally changes from "H" level to "L" level.

Though not shown, when the input signal IN01 changes from "H" level to "L" level, the second level shifter 207 with the signal generator circuit operates such that the second output signal OUT02 first changes from "L" level to "H" level, then the third output signal OUT03 changes from "H" level to "L" level, while the fourth output signal OUT04 changes from "L" level to "H" level, and the first output signal OUT01 finally changes from "H" level to "L" level.

In this way, the first level shifter 107 with the signal generator circuit or the second level shifter 207 with the signal generator circuit is applied with control signals which comprise a combination of an output signal at high voltage level with an output signal at low voltage level (i.e., a combination of the first output signal OUT01 with the fourth output signal OUT04, or a combination of the second output signal OUT02 with the third output signal OUT03), wherein a timing at which the output signal transitions to "H" level is advanced, while a timing at which the output signal transitions to "L" level is delayed in accordance with a change in the input signal IN01, a through current can be prevented from occurring.

The level shifters 106, 107, 206, 207 having a signal generator circuit according to the present invention can be used, for example, for testers for a variety of electronic circuits, and the like.

The present invention is not limited to the foregoing first and second embodiments, but various applications and modifications can be made without departing from the spirit and scope of the invention. For example, in the second embodiment, high voltage inverters are used for preventing broken gate films of the NAND L1 and NAND L2, however, any circuit can be employed instead as long as it can convert a voltage from a high voltage to a low voltage.

This application is based on Japanese Patent Application No. 2004-173151 which is herein incorporated by reference.

What is claimed is:

1. A signal generator circuit comprising:
   an output adjustor circuit for outputting a first output signal and a second output signal in accordance with an input signal; and
   a level shifter unit for converting a voltage level in accordance with the input signal to output a third output signal and a fourth output signal,
   wherein in response to a rising of the input signal, the first output signal first changes, the third and fourth output signals change subsequently, and then the second output signal changes, and
   in response to a falling of the input signal, the second output signal first changes, the third and fourth output signals change subsequently, and then the first output signal changes.

2. A signal generator circuit according to claim 1 wherein the third output signal and the fourth output signal are opposite to each other.

3. A signal generator circuit according to claim 1, wherein the third and fourth output signals have an amplitude larger than an amplitude of the first and second output signals.

4. A signal generator circuit according to claim 1, wherein the first and second output signals are in a low voltage output region, while the third and fourth output signals are in a high voltage output region.

5. A signal generator circuit according to claim 2, wherein the first and second output signals are in a low voltage output region, while the third and fourth output signals are in a high voltage output region.

6. A signal generator circuit according to claim 3, wherein the first and second output signals are in a low voltage output region, while the third and fourth output signals are in a high voltage output region.

7. A signal generator circuit according to claim 1, wherein said output adjustor circuit generates the first output signal in accordance with an inverted version of the input signal and a delayed version of the second output signal, and generates the second output signal in accordance with the input signal and a delayed version of the first output signal.

8. A signal generator circuit according to claim 7, wherein:
   the inverted version of the input signal and the delayed version of the second output signal are applied to a first NAND element, the output of which is the first output signal; and
   the input signal and the delayed version of the first output signal are applied to a second NAND element, the output of which is the second output signal.

9. A signal generator circuit according to claim 1, wherein said output adjustor circuit outputs the first and second output signals based on the third and fourth output signals.

10. A signal generator circuit according to claim 9, wherein said output adjustor circuit generates the first output signal in accordance with the input signal and the third output signal, and generates the second output signal in accordance with the input signal and the fourth output signal.

11. A signal generator circuit according to claim 10, wherein:
   the input signal and the third output signal are applied to a third NAND element, the output of which is the first output signal; and
   the input signal and the fourth output signal are applied to a fourth NAND element, the output of which is the second output signal.

12. A signal generator circuit according to claim 11, wherein said third NAND element is applied with an inverted version of the input signal and the third output signal, and said fourth NAND element is applied with an inverted version of the fourth output signal.

13. A signal generator circuit having an output adjustor circuit for generating an output signal at a low voltage level, and a level shifter unit for generating an output at a high voltage level, wherein:
   said level shifter unit comprises a first delay element, a first low voltage inverter, a high voltage power supply, a ground potential, a first and a second high voltage side output terminal, a first and a second high voltage P-ch transistor, a first and second high voltage inverter, and a first and a second high voltage N-ch transistor,
   said first delay element having an input side connected to an input terminal for receiving an input signal, and an output side connected to an input side of said first low voltage inverter and to a gate of said first high voltage N-ch transistor;
   said first high voltage P-ch transistor having a source connected to said high voltage power supply, a gate branched for connection to a line which connects a drain of said second high voltage P-ch transistor with a drain of said second high voltage N-ch transistor, and a drain connected to a drain of said first high voltage N-ch transistor;
   said second high voltage P-ch transistor having a source connected to said high voltage power supply, a gate branched for connection to a line which connects the drain of said first high voltage P-ch transistor with a drain of said first high voltage N-ch transistor, and the drain connected to the drain of said second high voltage N-ch transistor;
   said first high voltage N-ch transistor having a source connected to said ground potential, the gate branched for connection to a line which connects the other end side of said first delay element with the input side of said first low voltage inverter, and the drain connected to the drain of said first high voltage P-ch transistor;
   said second high voltage N-ch transistor having a source connected to said ground potential, a gate connected to an output side of said first low voltage inverter, and the drain connected to the drain of said second high voltage P-ch transistor;
   said first high voltage side output terminal being branched for connection to a line which connects the drain of said first high voltage P-ch transistor with the drain of said first high voltage N-ch transistor through said first high voltage inverter; and
   said second high voltage side output terminal being branched for connection to a line which connects the drain of said second high voltage P-ch transistor with the drain of said second high voltage N-ch transistor through said second high voltage inverter, and
   said output adjustor circuit comprises an input terminal for receiving an input signal, a first and a second low voltage side output terminal, a plurality of delay elements, a second low voltage inverter, and a first and a second low voltage NAND element;
   said first low voltage NAND element having one input side connected to said input terminal through said second low voltage inverter, and the other input side branched for connection to a line which connects an output side of said second low voltage NAND element with said second low voltage side output terminal through a plurality of delay elements; and
   said second low voltage NAND element having one input side branched for connection to a line which connects the output side of said first low voltage NAND element with said first low voltage side output terminal, and the other input side connected to said input terminal.

14. A signal generator circuit having an output adjustor circuit for generating an output signal at a low voltage level, and a level shifter unit for generating an output at a high voltage level, wherein:
   said level shifter unit comprises a first delay element, a first low voltage inverter, a high voltage power supply, a ground potential, a first and a second high voltage side output terminal, a first and a second high voltage P-ch transistor, a first and second high voltage inverter, and a first and a second high voltage N-ch transistor,
   said first delay element having an input side connected to an input terminal for receiving an input signal, and an output side connected to an input side of said first low voltage inverter and to a gate of said first high voltage N-ch transistor;
   said first high voltage P-ch transistor having a source connected to said high voltage power supply, the gate branched for connection to a line which connects a drain of said second high voltage P-ch transistor with a drain of said second high voltage N-ch transistor, and a drain connected to a drain of said first high voltage N-ch transistor;
   said second high voltage P-ch transistor having a source connected to said high voltage power supply, a gate branched for connection to a line which connects the drain of said first high voltage P-ch transistor with the drain of said first high voltage N-ch transistor, and the drain connected to the drain of said second high voltage N-ch transistor;
   said first high voltage N-ch transistor having a source connected to said ground potential, a gate branched for connection to a line which connects the other end side of said first delay element with the input side of said first low voltage inverter, and the drain connected to the drain of said first high voltage P-ch transistor;

said second high voltage N-ch transistor having a source connected to said ground potential, a gate connected to an output side of said first low voltage inverter, and the drain connected to the drain of said second high voltage P-ch transistor;

said first high voltage side output terminal being branched for connection to a line which connects the drain of said first high voltage P-ch transistor with the drain of said first high voltage N-ch transistor through said first high voltage inverter; and said second high voltage side output terminal being branched for connection to a line which connects the drain of said second high voltage P-ch transistor with the drain of said second high voltage N-ch transistor through said second high voltage inverter, and said output adjustor circuit comprises an input terminal for receiving an input signal, a first and a second low voltage side output terminal, a second low voltage inverter, a third and a fourth high voltage inverter, and a first and a second low voltage NAND element;

said first low voltage NAND element having one input side connected to said input terminal through said second low voltage inverter, and another input side branched for connection to a line which connects an output side of said first high voltage inverter with said first high voltage side output terminal through said third high voltage inverter;

said second low voltage NAND element having one input side branched for connection to a line which connects an output side of said second high voltage inverter through said fourth high voltage inverter, and the other input side connected to said input terminal.

15. A level shifter having a signal generator circuit, comprising:

a signal generator circuit having an output adjustor circuit for outputting a first output signal and a second output signal in accordance with an input signal, and a level shifter unit for converting a voltage level in accordance with the input signal to output a third output signal and a fourth output signal, wherein in response to a rising of the input signal, the first output signal first changes, the third and fourth output signals next change, and then the second output signal changes, and in response to a falling of the input signal, the second output signal first changes, the third and fourth output signals change, and then the first output signal changes; and a level shifter for outputting a first and a second amplified output signal, the voltage level of which is amplified, said first and second amplified output signals simultaneously transitioning to "H" level or "L" level based on one of the first and second output signals and one of the third and fourth output signals of said signal generator circuit.

16. A level shifter having a signal generator circuit according to claim 15, wherein:

one of the third and fourth output signals of said signal generator circuit used by said level shifter is a signal which change in a reverse direction to one of the first and second output signals of said signal generator circuit.

17. A level shifter having a signal generator circuit according to claim 16, wherein:

said level shifter comprises a first and a second low voltage NAND element, a high voltage power supply, a ground potential, a first to a fourth P-ch transistor, a first and a second output terminal for outputting said first and second amplified output signals, respectively, a first and a second high voltage N-ch transistor, said first low voltage NAND element having one input side connected to an input terminal for receiving a second input signal, and the other input side connected to an output terminal for outputting a second output signal;

said second low voltage NAND element having one input side connected to an output side of said first low voltage NAND element, and the other input side connected to an output terminal for outputting one of the first and second output signals of said signal generator circuit;

said first high voltage P-ch transistor having a source connected to said high voltage power supply, a gate connected to an output terminal for outputting one of the third and fourth output signals of said signal generator circuit, and a drain connected to a source of said second high voltage P-ch transistor;

said second high voltage P-ch transistor having the source connected to the drain of said first high voltage P-ch transistor, a gate branched for connection to a line which connects a drain of said fourth high voltage P-ch transistor with a drain of said second high voltage N-ch transistor, and a drain connected to the drain of said first high voltage N-ch transistor;

said third high voltage P-ch transistor having a source connected to said high voltage power supply, a gate connected to said output terminal for outputting one of the third and fourth output signals of said signal generator circuit, and a drain connected to a source of said fourth high voltage P-ch transistor;

said fourth high voltage P-ch transistor having the source connected to the drain of said third high voltage P-ch transistor, a gate branched for connection to a line which connects the drain of said second high voltage P-ch transistor with the drain of said first high voltage N-ch transistor, and the drain connected to the drain of said second high voltage N-ch transistor;

said first high voltage N-ch transistor having a source connected to said ground potential, a gate branched for connection to a line which connects the output side of said first low voltage NAND element with one input side of said second low voltage NAND element, and the drain connected to the drain of said second high voltage P-ch transistor; and said second high voltage N-ch transistor having a source connected to said ground potential, a gate connected to the output side of said second low voltage NAND element, and the drain connected to the drain of said fourth high voltage P-ch transistor;

said first output terminal being branched for connection to a line which connects the drain of said second high voltage P-ch transistor with the drain of said first high voltage N-ch transistor; and said second output terminal being branched for connection to a line which connects the drain of said fourth high voltage P-ch transistor with the drain of said second high voltage N-ch transistor.

18. A level shifter having a signal generator circuit according to claim 16, wherein:

said level shifter comprises a first and a second low voltage NOR element, a high voltage power supply, a ground potential, a first to a fourth high voltage P-ch transistor, a first and a second output terminal, and a first and a second high voltage N-ch transistor, said first low voltage NOR element having one input terminal connected to an input terminal for receiving a second input signal, and the other input side connected to an output terminal for outputting one of the first and second output signals of said signal generator circuit;

said second low voltage NOR element having one input side connected to an output side of said first low voltage NOR element, and the other input side connected to the output terminal for outputting one of the first and second output signals of said signal generator circuit-;

said first high voltage P-ch transistor having a source connected to said high voltage power supply, a gate connected to an output terminal for outputting one of the third and fourth output signals of said signal generator circuit, and-a drain branched for connection to a line which connects a drain of said second high voltage P-ch transistor with a drain of said first high voltage N-ch transistor;

said second high voltage P-ch transistor having a source connected to said high voltage power supply, a gate branched for connection to a line which connects a drain of said third high voltage P-ch transistor with a drain of said second high voltage N-ch transistor, and a drain connected to the drain of said first high voltage N-ch transistor;

said third high voltage P-ch transistor having a source connected to said high voltage power supply, a gate branched for connection to a line which connects the drain of said second high voltage P-ch transistor with the drain of said first high voltage N-ch transistor, and a drain connected to the drain of said second high voltage N-ch transistor;

said fourth high voltage P-ch transistor having a source connected to said high voltage power supply, a gate connected to the output terminal for outputting one of the third and fourth output signals of said signal generator circuit, and a drain branched for connection to a line which connects the drain of said third high voltage P-ch transistor with the drain of said second high-voltage N-ch transistor;

said first high voltage N-ch transistor having a source connected to said ground potential, a gate branched for connection to a line which connects the output side of said first low voltage NOR element with the one input side of said second low voltage NOR element, and a drain branched for connection to the drains of said first and second high voltage P-ch transistors;

said second high voltage N-ch transistor having a source connected to said ground potential, a gate connected to the output side of said second low voltage NOR element, and the drain branched for connection to the drains of said first and second high voltage P-ch transistors;

said first output terminal being branched for connection to a line which connects the drains of said first and second high voltage P-ch transistors with the drain of said first high voltage N-ch transistor; and said second output terminal being branched for connection to a line which connects the drains of said third and fourth high voltage P-ch transistors with the drain of said second high voltage N-ch transistor.

* * * * *